(12) United States Patent
Hobbs et al.

(10) Patent No.: US 7,304,775 B2
(45) Date of Patent: Dec. 4, 2007

(54) ACTIVELY STABILIZED, SINGLE INPUT BEAM, INTERFERENCE LITHOGRAPHY SYSTEM AND METHOD

(75) Inventors: Douglas S. Hobbs, Lexington, MA (US); James J. Cowan, Lexington, MA (US)

(73) Assignee: CoHo Holdings, LLC, Burlington, MA (US)

( * ) Notice: Subject to any disclaimer, the term of this patent is extended or adjusted under 35 U.S.C. 154(b) by 0 days.

(21) Appl. No.: 09/798,746

(22) Filed: Mar. 2, 2001

(65) Prior Publication Data

US 2001/0035991 A1 Nov. 1, 2001

Related U.S. Application Data

(60) Provisional application No. 60/186,893, filed on Mar. 3, 2000.

(51) Int. Cl.
*G03H 1/12* (2006.01)
*G03H 1/10* (2006.01)
*G03H 1/04* (2006.01)

(52) U.S. Cl. ............................. 359/11; 359/10; 359/1; 359/35; 430/1

(58) Field of Classification Search .................... 359/1, 359/10, 8, 28, 30, 35, 11, 12; 369/10; 356/347, 356/348; 430/1
See application file for complete search history.

(56) References Cited

U.S. PATENT DOCUMENTS 5,142,385 A * 8/1992 Anderson et al. ............. 359/1
5,216,527 A * 6/1993 Sharnoff et al. .............. 359/10
5,892,597 A * 4/1999 Iwata et al. ................... 359/11
5,949,557 A * 9/1999 Powell ........................... 359/8

* cited by examiner

*Primary Examiner*—Audrey Chang
(74) *Attorney, Agent, or Firm*—Brian M. Dingman; Mirick, O'Connell, DeMallie & Lougee, LLP

(57) ABSTRACT

An interference lithography system is described that is capable of exposing high resolution patterns in photosensitive media and employing yield increasing active stabilization techniques needed in production environments. The inventive device utilizes a division-of-wavefront interference lithography configuration which divides a single large field size optical beam using one or more mirrors, and is actively stabilized with a subsystem employing; a phase modulator operating on each divided wavefront section; a novel feedback apparatus for observing the relative phase shifts between interfering wavefront sections; and a control system for holding the relative phase shifts constant. The present invention also includes; a method for shaping the illumination beam's intensity distribution for more efficient power utilization and greater feature size uniformity; a horizontal substrate loading configuration compatible with robotic handling; an automated pattern pitch calibration for simple, flexible system reconfiguration; a compact cleanroom compatible superstructure for increased passive stability in high vibration manufacturing environments; and a method for optimizing the polarization state of the interfering beam sections in a multiple mirror system.

18 Claims, 19 Drawing Sheets

Prior Art

Prior Art

ACTIVELY STABILIZED, SINGLE INPUT BEAM, INTERFERENCE LITHOGRAPHY SYSTEM AND METHOD

CROSS REFERENCE TO THE RELATED APPLICATION

This application claims priority from U.S. Provisional Patent Application Ser. No. 60/186,893, entitled "Actively Stabilized, Single Input Beam, Interference Lithography Tool For Production Environments," filed Mar. 3, 2000. The disclosure of this provisional patent application is incorporated herein by reference in its entirety.

BACKGROUND OF THE INVENTION

1. Field of the Invention

The present invention relates to interference lithography techniques capable of generating periodic arrays of sub-micron sized structures. Specifically, wavefront division (WD) interference lithography is enhanced through the incorporation of a novel active stabilization technique. In addition, the disclosed invention relates to the incorporation of actively stabilized WD interference lithography in a flexible configuration, high-throughput, production-worthy system. Such a system finds countless applications in the telecommunications, display, biotechnology, semiconductor, and data storage industries.

2. Description of the Prior Art

Interference Lithography (sometimes referred to as holographic or interferometric lithography) is a proven technology used primarily in research and device prototyping laboratories. The main advantage of the technology is the ability to pattern sub-micron-sized features in arrays covering large areas.

Interference Lithography (IL) exploits the mutual coherence of multiple optical beams derived from a single light source such as a laser. The beams are made to overlap in some region of space where they interfere to produce patterns of light and dark areas which repeat on a scale proportional to the wavelength of the laser. The interference pattern exists throughout a volume of space and can be recorded by photosensitive media such as photoresist, placed within the overlap region. Conventional contact or projection photomasks are not required, yielding what has become known as a 'maskless' lithography technique. In addition, by exploiting inherent photoresist and etching process non-linearities, a variety of surface relief structures can be generated with no change in the optical configuration.

There are two main types of interference lithography practiced in the art. They are known as division-of-amplitude and division-of-wavefront, both of which are taught extensively by U.S. Pat. No. 4,496,216. Division-of-amplitude is most commonly practiced due to its greater control over the parameters governing the production of a stable, high contrast interference pattern. For example, one skilled in the art can readily adjust the positions, angles, phase, and polarization state of each interfering beam as described in U.S. Pat. No. 6,088,505, and the relative phases of the interfering beams can be locked with an active system as described in U.S. Pat. No. 5,142,385. Despite these advantages, division-of-wavefront IL is preferred when the application calls for extremely small feature sizes in the sub-half-micron range due to its simplified optical configuration, and the inherent high stability of the interference pattern. These advantages have not been fully realized in high-volume manufacturing environments since existing methods for actively stabilizing the interference patterns produced by a division-of-wavefront configuration, have not been practical. In addition, the use of division-of-wavefront IL in applications requiring the fabrication of structures which vary in two dimensions, has been limited due to the lack of a practical method for optimizing the interference pattern contrast, and the additional complexity of incorporating an active stabilization system which operates on more than one divided beam section.

Many applications would benefit from the sub-half-micron sized structures that can be produced using a division-of-wavefront interference lithography technique. A primary example is found in the production of gratings within the structure of semiconductor lasers used in optical telecommunications. Such light sources are known as distributed feedback lasers (DFB). They are typically constructed from indium phosphide (InP) material and are used extensively within wavelength division multiplexing, or WDM optical networks. These solid state lasers emit light in a multi-longitudinal mode—there exist numerous narrow band wavelengths clustered about the center wavelength. The grating incorporated within a DFB laser acts as a filter to limit the lasing output to a single narrow-banded mode important for high-speed telecommunications. Gratings are currently produced in one of three ways; 1) a phase mask technique, 2) e-beam lithography, or most commonly 3) interference lithography. The first two techniques suffer from practical limitations such as small field size, stitching errors, short mask lifetimes, low throughput, and high cost. Interference lithography is used in laboratory environments to produce DFB gratings with the advantages of large area, high throughput, no stitching errors and no conventional photo-masks or expensive phase masks. Additional advantages of IL technology include: a virtually unlimited field size; substrate flatness is not an issue due to the three-dimensional nature of the interference pattern; IL tools are relatively inexpensive; and the fabrication process is compatible with current semiconductor photo-processing.

Many telecommunications components manufacturers utilize benchtop IL systems configured in A division-of-wavefront arrangement for the production of the gratings within DFB lasers. FIGS. 1a and 1b depict the patterning components 10 of a division-of-wavefront IL system used to produce gratings with feature spacings suitable for DFB lasers. A single large diameter beam derived from a well polarized 32 (optimally s-polarization where the electric vector vibrates perpendicular to the plane of the drawing), temporally coherent laser source, is directed toward the intersection of two planes defined by a mirror 12 with reflective surface 14, and a workpiece 20 consisting of a substrate 18 supporting a layer of photosensitive media 16. As depicted in the figures, a portion of the beam is folded onto itself by the mirror 12. In these examples, the lower portion of the beam's wavefront 28 is incident directly upon the light sensitive material 16 at an angle $\theta i$, while the upper portion 30 is re-directed through reflection from the mirror 12 and falls upon the photosensitive medium 16 (placed in the recording plane 24) from the opposite angle $-\theta i$. An interference pattern, which has the form of a spatial modulation of the light beam in one direction, is created by the overlapping beam sections and recorded as a grating by the photosensitive medium 16 placed within the overlap volume 26. In cross section, the intensity of the interfering light varies with a sinusoidal distribution which repeats according to the classic relation:

$$\Lambda = \lambda/n\ \mathrm{SIN}(\theta 1 + \theta 2) = \lambda/2\ \mathrm{SIN}(\theta i),\ \mathrm{when}\ \theta 1 = \theta 2 = \theta i,\ \mathrm{and}\ n=1.$$

Here Λ is the period over which the pattern repeats, λ is the wavelength of the illumination, n is the optical index of refraction of the medium in which the beam travels, and θ1, θ2 are the angles at which the beams are incident upon the recording plane (measured with respect to a line perpendicular to the recording plane 34). FIG. 1a shows the folding mirror geometry which would lead to a pattern pitch of 270 nanometers (nm) when using laser light with a wavelength of 350.7 nanometers in the ultraviolet part of the electromagnetic spectrum. FIG. 1b shows a means for reducing this pattern pitch to 187 nm simply by changing the angle at which the light is incident upon the folding mirror 12 and workpiece 20.

To make an effective recording of the interference patterns produced by any type of IL system, the pattern must remain stationary in space during a time which is sufficient to expose the light modulation in the light sensitive material 16. This requires that all vibrations and disturbances leading to a displacement of the light sensitive material relative to the interference pattern, or causing the relative phases of the interfering optical beams to drift over the recording time, be eliminated. Due primarily to the short path lengths traveled by the split beam halves in a folding-mirror division-of-wavefront IL configuration, the passive stability of the system is far superior to the division-of-amplitude technique. However, as the size of the grating features is reduced toward the 100 nanometer sizes needed for DFB lasers operating about the 1300 nm wavelength, small mechanical and thermal disturbances in the system become significant, and consequently manufacturers find that their yields are low and that their systems require highly skilled operators. The solution to these problems is to add active stabilization to the IL system as taught in U.S. Pat. No. 5,142,385. Active stabilization requires a means for observing the relative phase drift of the interfering beam halves, and a modulator to compensate for the change. In a conventional, division-of-amplitude IL system, a transmissive electro-optic phase modulator is employed which intercepts only one of the interfering beams. This technique is not readily implemented in the folding mirror division-of-wavefront IL system due to the close proximity of the interfering beams. An alternative is to employ a moving mirror to modulate the phase of one of the interfering beams. However, traditionally a moving mirror has been considered impractical for the division of-wavefront IL system because of the large size of the mirror required. As described herein, it is an object of this invention to provide a practical method of incorporating a phase modulator in a folding mirror division-of-wavefront IL system.

The more difficult problem of obtaining the feedback signal indicating the relative phase drift in a folding mirror division-of-wavefront IL system, is not obvious and is a main object of the disclosed invention. What is needed is a means to magnify the interference pattern so that any pattern motion can be observed using an automated system such as a camera or detector pair. Prior art demonstrations have employed a grating placed in the region of space containing the interference pattern. Diffracted orders from the grating interfere at a shallow angle producing a macroscopic pattern of light and dark lines known as 'fringes'. Motion, or a change in brightness of these macroscopic fringes relate directly to shifts in the microscopic fringe pattern. In one demonstration, this macroscopic pattern was employed strictly as a guide to align conventional photolithographic images with IL patterns, and no real time stabilization of an interference pattern was envisioned. An earlier demonstration employed the macroscopic fringes for active stabilization of a conventional division-of-amplitude IL system operating to produce a specific grating pitch. This system was limited due to the precise alignment needed to produce an observable macroscopic fringe pattern, and the need to fabricate a new grating for each pattern pitch desired. DFB laser manufacturers must vary the pitch of their gratings to change the resulting DFB laser wavelength. Thus, to satisfy DFB production goals, a practical means is needed for incorporating active stabilization into a re-configurable, production-worthy division-of-wavefront IL system.

In the fabrication of DFB lasers, the grating is produced by etching directly into the semiconductor material using an etch mask comprised of a material known as photo-resist. Photoresist is light sensitive and produces the surface relief structure needed for the etch mask. Thus photoresist is the preferred light sensitive material 16 used to record the interference pattern produced in an IL system. After exposing the photoresist in an IL system, it is processed using standard wet chemical techniques developed for the semiconductor industry. The result is an etch mask consisting of lines of photoresist material which have a cross section and spacing suitable for DFB laser fabrication. A depiction of such a grating is shown in FIG. 2. The bright lines are composed of photoresist, and these lines are supported by an indium phosphide substrate.

To produce gratings with a line spacing in the range of 130 to 190 mn, the technique known as prism coupling can be employed. Such gratings could be used to produce shorter wavelength DFB lasers for communications in local area networks and cable television, or gratings for controlling the polarization of light in display applications. The prism coupling method operates on the principle that the incident wavelength is shortened by the value of the index of refraction of the medium through which the beam passes. Referring to the equation for the grating pitch given above, note that the optical refractive index of the material in which the interfering beams travel is inversely proportional to the pattern pitch. Thus by interfering the optical beams within a higher index medium such as glass (n~1.5), we can reduce the pattern pitch by the inverse of the glass index, 1/1.5, or 2/3. FIG. 3 depicts a folding mirror IL configuration 40 utilizing a glass prism 42 to increase the index of refraction of the medium surrounding the beam overlap volume 26. In this example, the angle of the prism face, θp is set equal to the angle of incidence of the optical beam in air θi. Once inside the prism, a reflective surface 14 applied to the back face of the prism 46, divides the illumination beam into wavefronts 28 and 30, which, as with the folding mirror IL system 10, subsequently overlap forming the interference volume 26. Optical contact or coupling, defined as the effective elimination of a material interface, is made to the workpiece 20 using a fluid 44 composed of a material with an optical refractive index which is a close match to the prism 42 material. Suitable materials are described throughout the literature, and include various forms of water, oils, solvents, and even gel materials. With this configuration and an optical illumination wavelength of 350.7 nm, the grating recorded by the light sensitive material 16, will have a line spacing of 150 nm. Again by changing the incident beam angle θi a grating pitch below 130 nm would be practical with this configuration. Note also that reflective surface 14 would become unnecessary when the incident beam angle is reduced below ~48° in this setup (i.e. when generating gratings with line spacings between 155 and 180 nm). This is due to the total internal reflection exhibited by a properly polarized optical beam 32 traveling within a higher index material when it encounters an interface with a lower refractive index. A method of incorporating an active stabilization system which integrates a phase modulator onto the prism, would make such a prism-based division-of-wavefront system practical.

A promising technology for producing electronic paper currently under development is that of reflective LCDs. The term 'crystal' in liquid crystal displays refers to the structure or ordering of the LC molecules into a definable or measurable state typically found with molecules in a solid state. This artificially created ordering is accomplished by depositing thin layers of material known in the art as 'alignment layers', which are typically processed using a physical rubbing or buffing technique. LCD manufacturers would experience an increase in yield by incorporating a non-mechanical, non-contact alignment layer process which did not produce static charge and was compatible with existing manufacturing equipment and environments. Such a process can be realized by patterning a fine pitch grating structure into the alignment material layer using a folding mirror division-of-wavefront IL system.

Another significant use of interference lithography is in the production of flat panel displays based on distributed cathode Field Emission Display, or FED, technology. FED technology is a strong competitor for LCDs in the flat panel display market. The most critical step in the fabrication of this distributed cathode matrix of an FED is the patterning of an array of holes or wells within which each emitter cone is grown. Typically, a light sensitive material such as photoresist has been employed to record an image of a hole array formed by lithographic techniques such as shadow masking (contact printing), optical projection, or electron beam writing. The hole array in photoresist then acts as an etch mask in the process of forming the holes. These patterns are limited by the resolution and field size of the imaging or writing systems, and complex, often expensive, workaround solutions are required to achieve modest field sizes of 50×50 mm with hole diameters in the 1 to 2 micron range. Recent work by many researchers has demonstrated that a reduction in the hole size (and consequently the emitter size), below the one micron range provides numerous benefits such as a reduced gate voltage, lower power consumption, greater current densities per pixel, and a built-in redundancy. Thus, to fully realize the potential of FED technology, an inexpensive, high speed, production environment lithographic system is needed which can produce sub-micron diameter hole arrays in large areas with few defects and low cost.

Other notable surface relief structures which can be patterned using IL, are known as 'motheye' or sub-wavelength-structure(SWS) surfaces. These surfaces have been shown to be effective at nearly eliminating the reflectance of light from an optical interface such as windows and refractive optical elements. To avoid diffraction effects, motheye surfaces must be generated with feature sizes and spacings smaller than the wavelength of light which will be employed, and the surface textures must vary in two dimensions to avoid polarization affects. For most infrared or visible wavelength applications, this necessitates structure sizes in the sub-micron to sub-half-micron range patterned over the entire window or optic area. A means for manufacturing motheye structures in high volumes and over large-areas is not currently available. An actively stabilized two-mirror division-of-wavefront IL system as disclosed herein, would make the production of motheye structures practical.

Interference lithography demonstrations in the laboratory have typically employed UV wavelength light derived from an argon ion gas laser. These gas lasers are highly automated and reliable making them a good choice for a manufacturing system. A wavelength in the deep blue is also available with these lasers, and the wavelength choice becomes a tradeoff between photoresist sensitivity and laser power. A large variety of photoresists possess high sensitivity to near UV light, known in the semiconductor industry as the 'i-line', whereas the number of blue wavelength ('g-line') sensitive photoresists is more limited, and the blue sensitivity is typically much lower. Many of the driving applications for the division-of-wavefront IL technology described above require nanometer scale feature sizes. Because the feature size produced in an IL system is directly related to the laser wavelength, using a near UV wavelength of 350.7 or 364.8 mn, results in 25% smaller feature sizes than an IL system operating in the blue at 442 or 458 nm. Thus an IL system operating in the UV can achieve the 200 nm grating pitch needed for DFB laser production, without resorting to exotic techniques such as prism coupling. However, there are several applications where gratings with feature sizes in the 60-80 nm range are required. For example, wire-grid polarizers designed to operate over the visible spectrum (400-700 nm) are constructed from gratings with pitches around 150 nm. As described above, the folding mirror division-of-wavefront IL system 40 shown in FIG. 3, can be adapted to pattern 150 mn pitch gratings through use of prism coupling techniques, or by utilizing a shorter wavelength UV source. The latter approach has become more feasible with the introduction of compact solid state sources such as the quadrupled Nd:YAG system (266 nm wavelength) manufactured by laser producers such as Coherent and Spectra-Physics.

Considering all of the potential applications of interference lithographic structures mentioned above, there is a need for a production device capable of making these structures in a fast and economical fashion.

SUMMARY OF THE INVENTION

With this background in mind, the inventive device described herein provides an actively stabilized, interference lithography system suitable for exposing light sensitive materials in production environments. Specifically, the wavefront-division interference lithography configuration is enhanced through the incorporation of a novel feedback mechanism and an unconventional phase modulation device allowing the system to be actively stabilized.

The inventive device allows for the high-volume, low cost production of surface structures for novel biomedical devices and sensors, grating structure alignment layers and tunable wavelength resonance gratings for reflective LCDs, flat panel array structures for FED displays, and motheye surface relief antireflection patterns.

It is another object of this invention to provide a manufacturing system enabling the production of very large scale integration, VLSI, semiconductor and electro-optic devices, and optical beam modulation devices.

The inventive device allows for the recording of interference patterns in light sensitive materials down to sizes suitable for production of wire-grid polarizers. By increasing the incident medium index of refraction through prism coupling, laser wavelengths not normally sufficient for producing nanometer-scale feature sizes can be utilized.

Prior art laboratory demonstrations have produced two-dimensional patterns suitable for FED, motheye, or LCD applications utilizing only two-beams in a division-of-amplitude IL technology. This requires a cumbersome mechanical rotation between two superimposed recordings, and is not practical in a production system. Consequently, the inventive device provides a patterning system based on three or four beam interference derived from a division-of-wavefront IL configuration that requires only a single exposure to generate two-dimensional arrays of holes, cones, posts, tips, vias, mesas, grids, or microlenses. Multi-beam intensity patterns also inherently possess a greater contrast between light and dark areas, which yields high aspect ratio structures.

The inventive device also incorporates an improved illumination setup yielding more uniform feature size patterning over larger areas. This is done by use of an apodizing filter which flattens the beam intensity distribution at the exposure plane.

The aforesaid objects are achieved individually and in combination, and it is not intended that the present invention be construed as requiring two or more of the objects to be combined unless expressly required by the claims attached hereto.

The objects of the present invention may be attained generally by providing a manufacturing device optionally consisting of seven major components: one, a source of polarized, coherent optical radiation with a wavelength suitable for exposing light sensitive materials such as that derived from a laser; two, a flexible, re-configurable beam delivery system with a means to expand or enlarge a single beam and propagate said beam over a distance sufficient to achieve minimal variation in pattern pitch; three, a means for apodizing the source beam to produce a more efficient energy distribution at the recording plane containing the light sensitive material; four, a division of wavefront system consisting of at least one mirror or prism where the diameter of the input beam is divided into two, three, or more sections, with each section redirected so as to overlap in a common region of space; five, a means for dynamically sensing and compensating for relative phase drifts between the divided beam sections; six, a means for enhancing the passive stability of the system to dampen typical manufacturing environment acoustical and mechanical vibrations; and seven, a mechanized stage with translation and rotation providing a wafer mount, and computer controller for replicating the patterning area over arbitrarily large substrates.

This invention features in one embodiment an interference lithography system for generating repetitive patterns suitable for recording by a light sensitive material, comprising: a platform for mounting a workpiece composed of or containing a light sensitive material on its surface; a beam delivery system for dividing and redirecting sections of a single optical beam toward said platform in an overlapping manner to form an optical interference pattern in the vicinity of the workpiece, said beam delivery system comprising: a plurality of folding mirrors having reflective surfaces from which sections of the illuminating optical beam can be divided and redirected; a support structure on which the folding mirrors are adjustably mounted; means for adjusting the positions and angles of the folding mirrors relative to said platform; and an adjustable apparatus for enlarging and directing a single optical beam toward said platform and folding mirrors; and an active stabilization system configured to sense and control the relative phases between the divided beam sections such that the position and contrast of the optical interference pattern remains relatively constant over a time, said active stabilization system comprising: a feedback apparatus for individually sampling each interfering beam section and indicating in response the relative optical phase between said beam sections; a phase modulating apparatus for adjusting the phase of an interfering beam section; and a control system, responsive to the feedback apparatus, for generating a proportionate control signal and providing it to the phase modulating apparatus to hold relatively constant the relative phase between two interfering beam sections.

In another embodiment, the invention features an interference lithography system for generating repetitive patterns suitable for recording by a light sensitive material, comprising: a platform for mounting a workpiece composed of or containing a light sensitive material on its surface; and a beam delivery system for dividing and redirecting sections of a single optical beam toward said platform in an overlapping manner to form an optical interference pattern in the vicinity of the workpiece, said beam delivery system comprising: two folding mirrors having reflective surfaces from which sections of the illuminating light beam can be divided and redirected; a support structure on which the folding mirrors are adjustably mounted; and means for adjusting the positions and angles of the folding mirrors relative to said platform.

The folding mirror surfaces may be substantially flat or curved. The reflective surfaces of the folding mirrors may be composed of a metal or of multiple layers of dielectric materials. The single optical beam may be transferred from a laser source to the workpiece and folding mirrors through reflection from a series of relay mirrors. The single optical beam may be enlarged and directed toward the workpiece and folding mirrors through reflection from a series of curved relay mirrors. The single optical beam may be relayed by the mirrors over a distance large enough to increase the beam's natural radius of curvature to a level approaching a plane parallel collimated beam.

The feedback apparatus may comprise a diffractive optical element or hologram which is placed next to the workpiece on said platform such that portions of each interfering beam section are redirected through diffraction from the hologram, and these sampled portions propagate co-linearly, in a direction perpendicular to said platform, so that a macroscopic interference pattern can be observed.

The feedback apparatus may comprise a beam splitting optical element which is placed next to the workpiece on said platform such that portions of each interfering beam section are simultaneously transmitted and reflected by the beam splitting element, where the transmitted sample from one beam section propagates co-linearly with a reflected sample of another beam section, so that a macroscopic interference pattern can be observed.

The phase modulating apparatus may comprise an electro-optic material integrated with a highly reflecting element. The electro-optic material may be a nematic liquid crystal contained within a cell constructed from one transmissive window and one highly reflecting window.

The control system may comprise an electronic light detection means sufficient to observe the macroscopic interference pattern produced by the feedback apparatus, and means for communicating the electronic image; one or more electronic detectors sufficient to generate an electronic signal proportional to the intensity of the optical beam; and a control means sufficient to receive and process the electronic image from the light detection means and the electronic signal, and in response to generate a suitable electronic impulse that is provided to the phase modulator.

The system may further comprise a prism in optical contact with the photosensitive surface, said prism refracting the optical beam incident on said prism and transmitting the refracted illuminating beam toward the intersection of a plane containing the workpiece and planes containing reflective surfaces, the reflective surfaces of said prism thereby dividing the illuminating beam into sections and redirecting these sections toward the workpiece, such that the light sensitive surface of the workpiece is selectively exposed to the interference pattern produced by the overlapping beam sections propagated within said prism. The prism may be in optical contact with the light sensitive surface via an intervening fluid having an optical index of refraction greater than the index of the ambient environment. The prism may have a base facing said platform and a single inclined face that receives the optical beam. The inclined face of said prism may be substantially flat.

This invention also features a method of performing interference lithography for generating repetitive patterns suitable for recording by a light sensitive material, the method comprising the steps of: (a) generating a coherent light source beam that is enlarged and directed toward the light sensitive material with an optical configuration such that the position and angle of the illuminating beam relative to the photosensitive medium can be adjusted; (b) dividing the illuminating beam into sections through reflection from mirrors oriented to cause the divided beam sections to overlap the undivided beam section in the region of the light sensitive material; and (c) exposing the light sensitive material with the light interference pattern formed by the overlapping beam sections.

Also featured is a method of performing interference lithography for generating repetitive patterns suitable for recording by a light sensitive material, the method comprising the steps of: (a) generating a coherent light source beam that is enlarged and propagated through an ambient environment having a known index of refraction, and directed toward the light sensitive material with an optical configuration such that the position and angle of the illuminating beam relative to the light sensitive material can be adjusted; (b) passing the illuminating beam through a medium having a higher index of refraction than the ambient environment index of refraction, the illuminating beam thus refracted by the medium; (c) dividing the illuminating beam propagating within the higher index medium into sections by reflection from mirrors immersed in the higher index medium and oriented to cause the divided beam sections to overlap the undivided beam section in the region of the light sensitive material; and (d) exposing the light sensitive material, also located within the higher index medium, with the light interference pattern formed by the overlapping beam sections.

BRIEF DESCRIPTION OF THE DRAWINGS

The aforementioned features and other advantages of the present invention, as well as the invention itself, will be more fully understood from the following description of specific embodiments thereof, particularly when read together with the accompanying drawings wherein like reference numerals in the various figures are utilized to designate like components.

DETAILED DESCRIPTION OF THE PREFERRED EMBODIMENTS

Figure 1A:
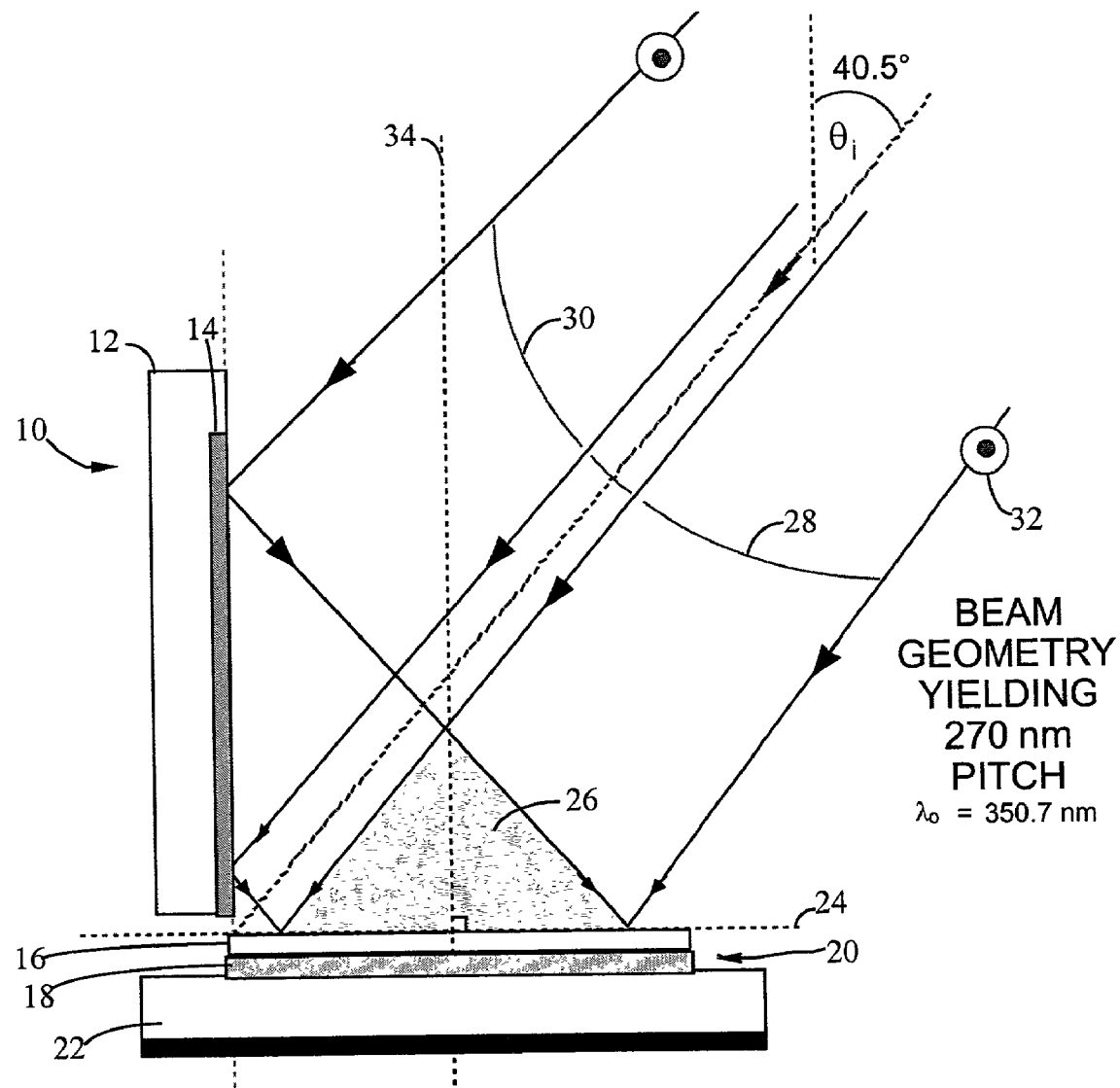
FIGS. 1a & 1b are diagrammatic views of a prior art folding mirror, single input beam, division-of-wavefront interference lithography system depicting the interference geometry suitable for patterning of gratings with coarse pitch (FIG. 1a), and fine pitch (FIG. 1b).
Figure 1B:
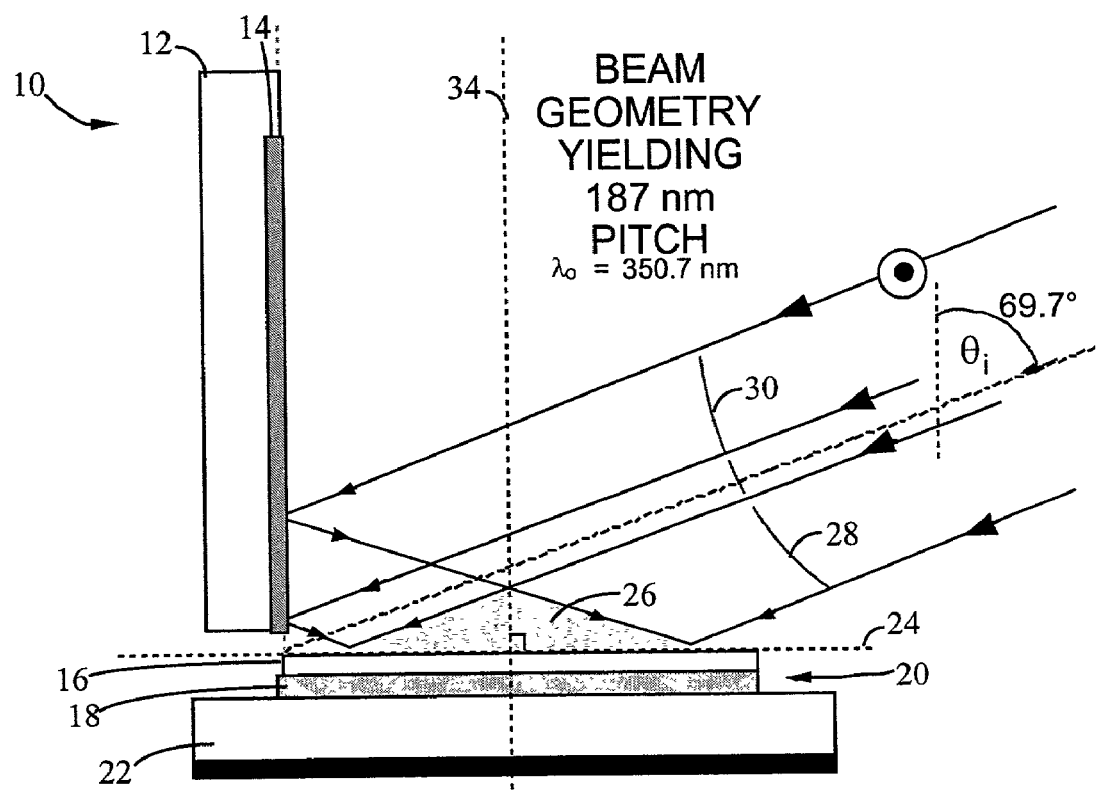
Figure 2:
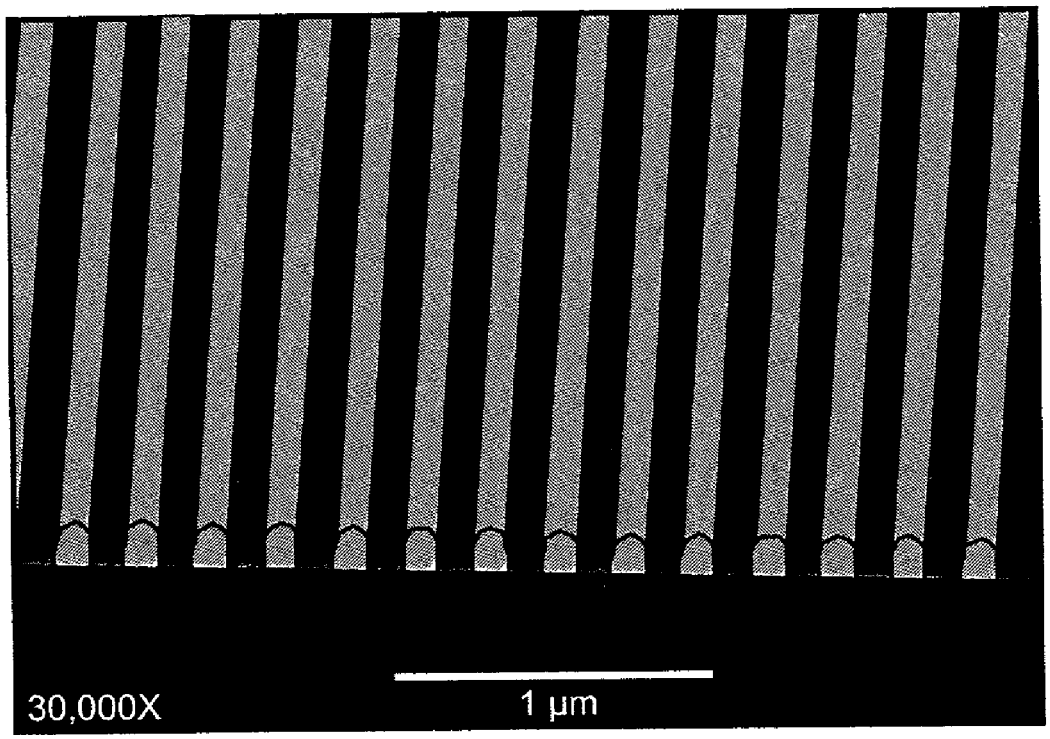
FIG. 2 is a prior art depiction showing a cross sectional view of a grating structure recorded in photoresist after being exposed in an interference lithography system and developed with standard wet-chemical processing.
Figure 3:
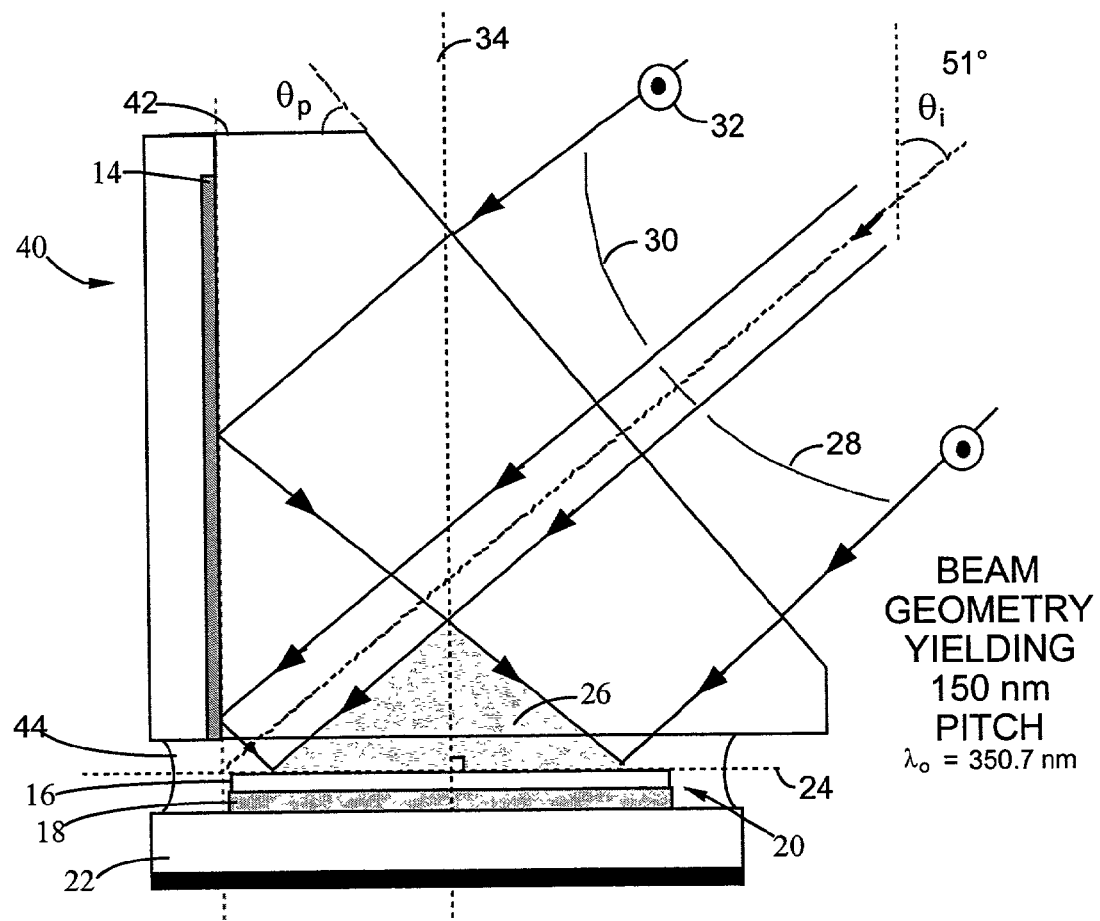
FIG. 3 is a diagrammatic view of a prior art, single input beam interference lithography system employing a prism to divide the beam and to generate a reduced grating pitch.

As used herein, a workpiece is defined to include a layer of light sensitive material by itself or in combination with other layers of materials, such as a substrate and/or other intervening layers, including planar, non-planar and irregularly shaped objects. For example, the workpiece can be a wafer or a panel. In the exemplary embodiment shown in FIGS. 1a and 1b, workpiece 20 is a wafer comprised of an indium phosphide substrate 18 with a photoresist coating 16 having a thickness in the range of from 1000 to 2000 angstroms(Å). As used herein, the term platform includes any mounting mechanism to which the workpiece can be secured in a desired position and orientation, including but not limited to a wafer stage and vacuum chuck arrangement. Optionally, the position of the platform can be controlled to correctly position the workpiece relative to the interference pattern produced by the optical configuration (e.g., the platform can be rotated and translated to insert and remove workpieces in a manufacturing process).

In accordance with the present invention, the limitations imposed by using the more preferable division-of-wavefront method of interference lithography, are overcome by employing an active stabilization system comprised of a novel feedback apparatus and method, and a non-mechanical phase modulating device. In addition, structures with features that vary in two dimensions can be produced in a folding mirror IL system by dividing the incident wavefront into more than two sections. This is accomplished most readily by a number of reflective mirrors, but could also be accomplished using a transparent solid material with multiple facets such as a tetrahedral prism.

Figure 4:
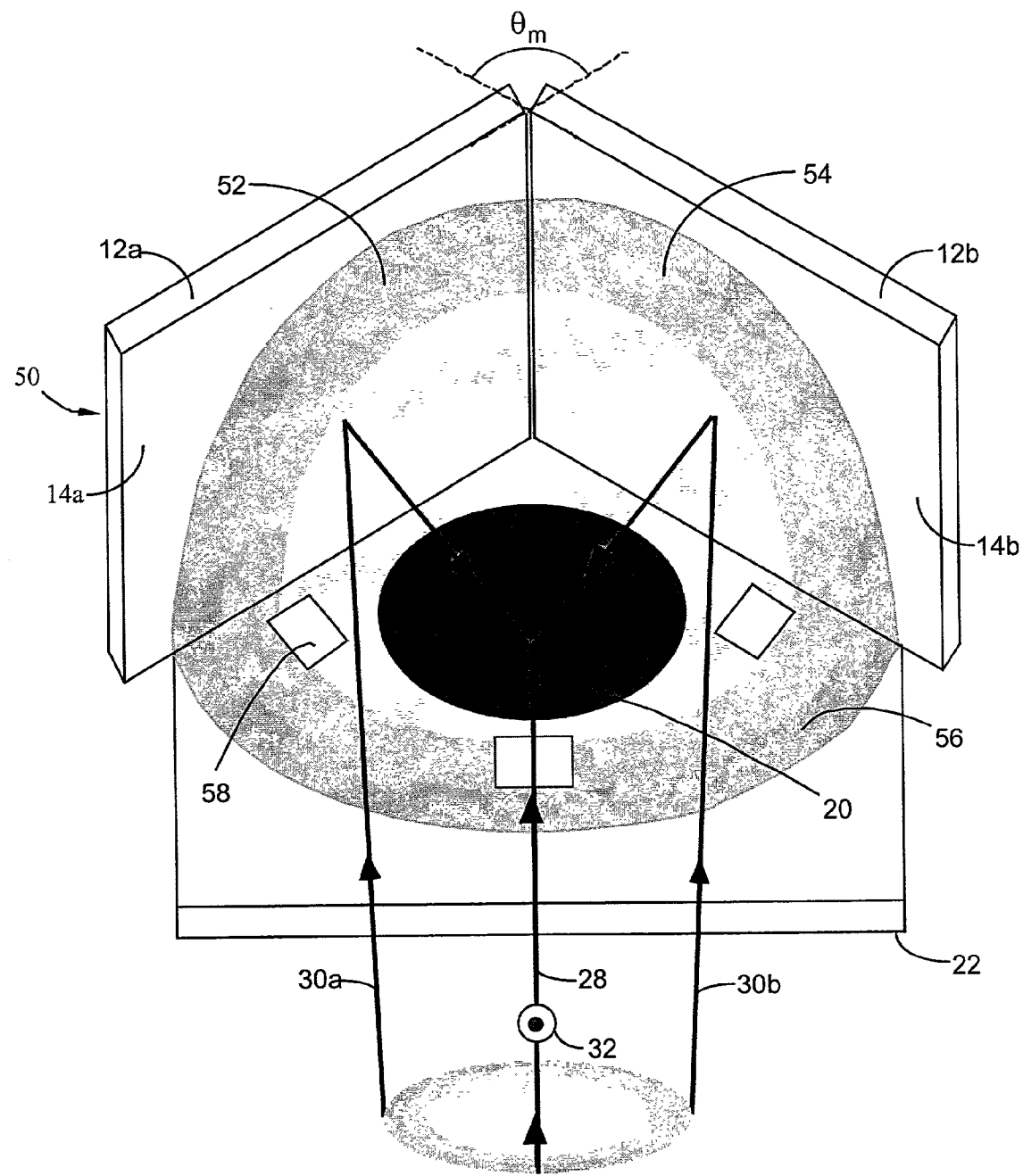
FIG. 4 is an overhead view of a single input beam interference lithography system of the present invention employing two folding mirrors for dividing and redirecting the input beam into three overlapping sections. Also shown are the feedback devices which form part of the active stabilization system.

FIG. 4 depicts a two-mirror folding IL configuration 50 for producing a variety of surface textures which vary in two dimensions such as via hole arrays, arrays of holes with tapered or cupped profiles, arrays of mesas and posts, and arrays of holes with stepped or staircase profiles. A properly polarized optical beam 32 is directed toward the intersection of three planes defined by mirrors 12a and 12b containing reflective surfaces 14a and 14b, and the platform 22 supporting the workpiece 20. In the FIG. 4 example, the source illumination is divided into three equal area pie-shaped sections 52, 54, 56 with sections 52 and 54 reflecting off surfaces 14a and 14b and thereby made to fold onto and overlap section 56 in the plane containing the workpiece 20. As further illustration, optical rays 28, 30a, 30b depict the direction in which each of the three sections propagates. To actively stabilize a multiple folding-mirror IL system requires one stabilizer loop for each mirror. The diffractive pattern generators needed for each stabilizer loop are optimally fabricated with features which vary in two dimensions so as to produce a macroscopic interference pattern with characteristics which can be correlated to separate pairs of interfering beams. FIG. 4 shows the use of three such pattern generators 58 placed within the region where all three beam sections overlap. Alternatively, the pattern generators 58 could be gratings oriented to sense the relative phase variations between a single pair of beam sections.

The angle θm shown in FIG. 4 determines the geometry of the resulting array of structures. When θm is 120°, the interference pattern generated will consist of repeating light and dark areas spaced on a grid in the shape of a hexagon—similar to the honeycomb pattern constructed by honey bees. A square or rectangular grid can be realized when θm is reduced to 90°.

Figure 5A:
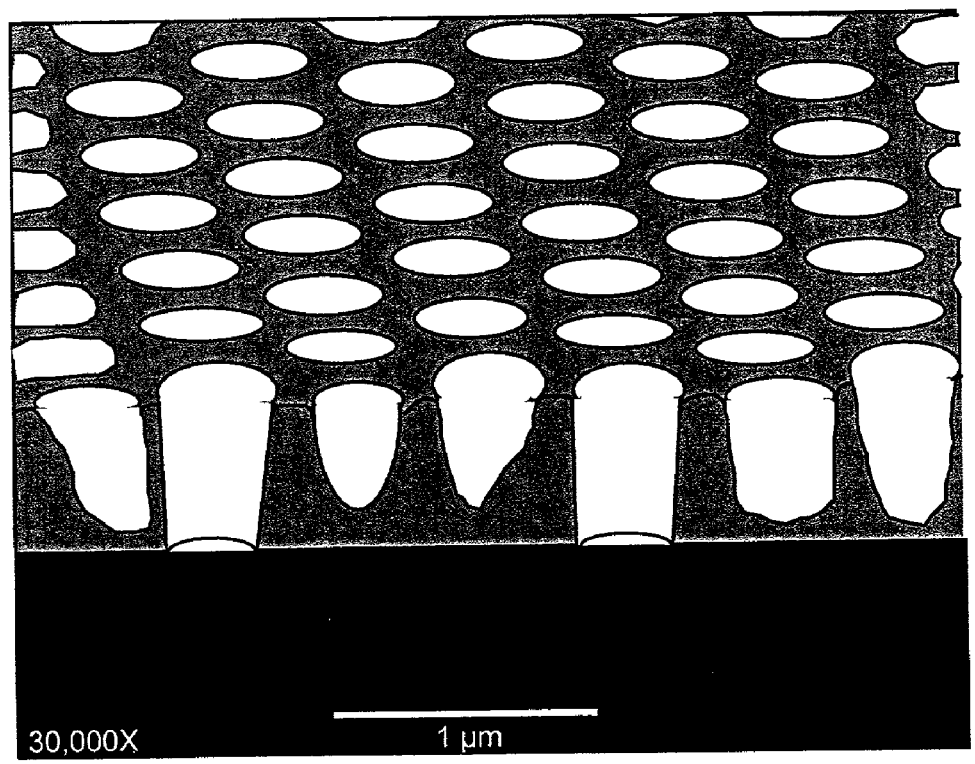
FIGS. 5a-5d are depictions showing holes recorded in photoresist after being exposed in a folding, two-mirror interference lithography system of the present invention, and developed with standard wet-chemical processing; 5a is a cross sectional view of an array of cylinder shaped holes; 5b is a cross section of an array of tapered holes with discrete steps in photoresist thickness; 5c is a cross section of an array of cup shaped wells in photoresist; 5d is a partial cross section of an array of posts in photoresist.
Figure 5B:
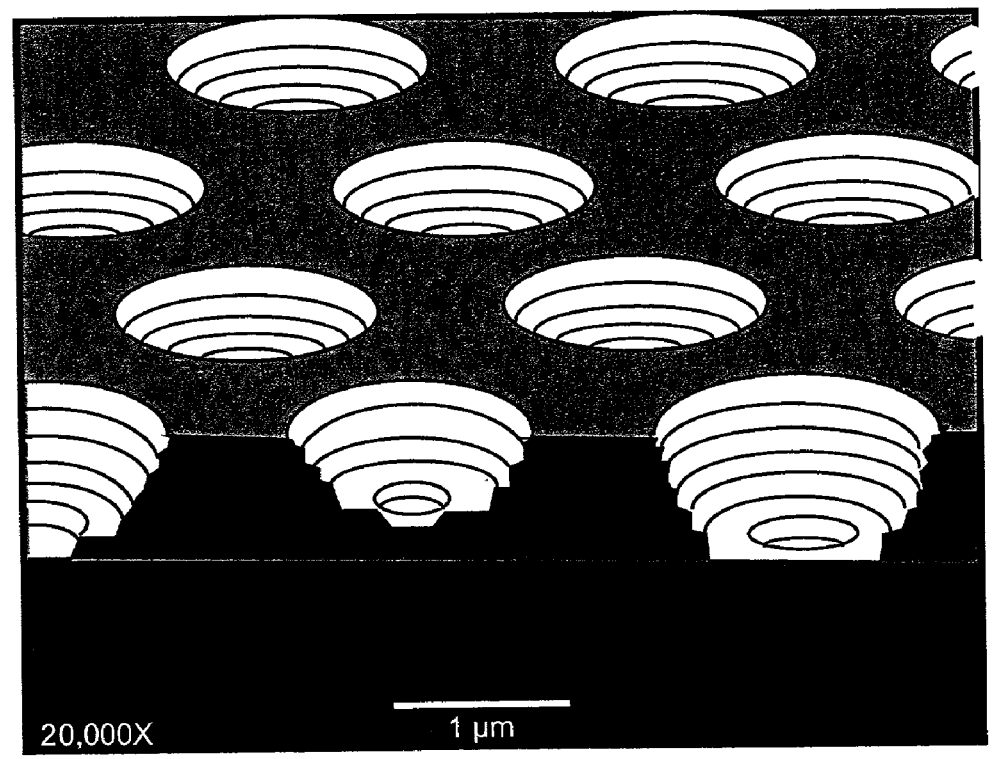
Figure 5C:
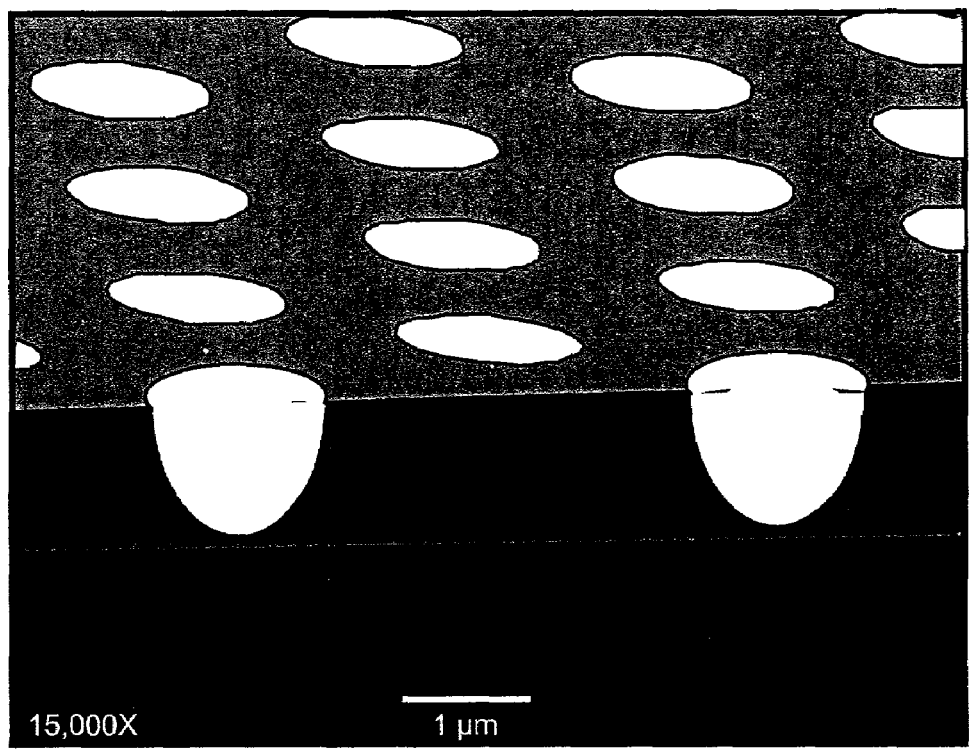
Figure 5D:
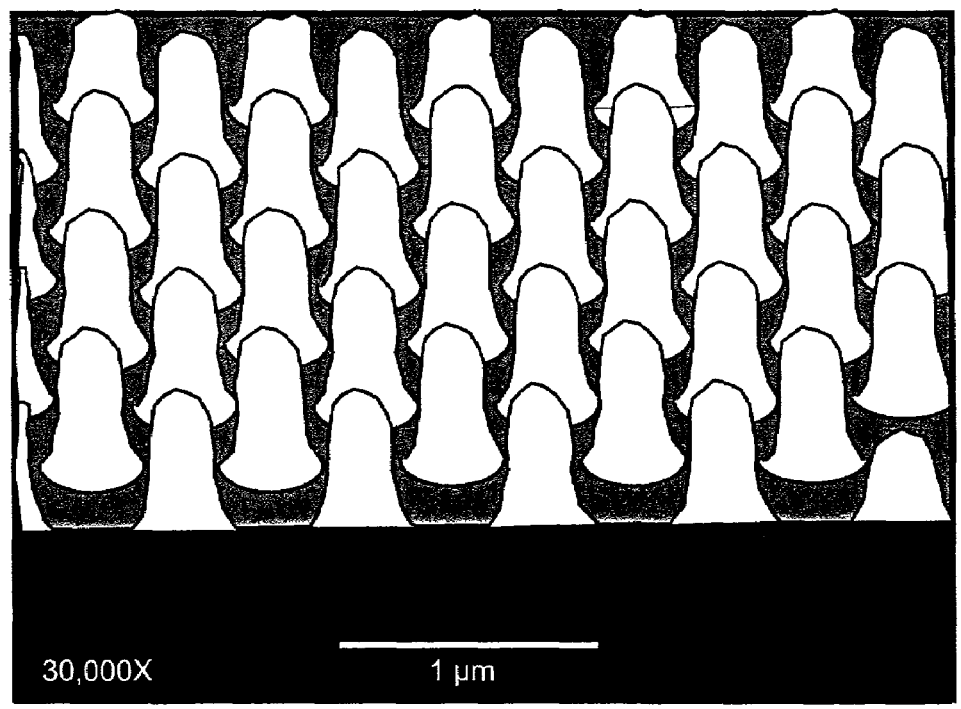

Magnified images of the profile of structures produced with a two-mirror folding IL system, are depicted in FIGS. 5a-5d. Each of the four images depicts a three-dimensional surface structure in a thin layer of photoresist supported by various substrates such as glass and silicon. FIG. 5a shows cylinder shaped holes in photoresist on a glass substrate. The approximately 300 nm diameter holes are arranged on a hexagonal grid with a 500 nm spacing between holes. FIG. 5b shows an array of 1300 nm diameter tapered holes defined by several circular plateaus in photoresist on a silicon substrate. FIG. 5c depicts 1200 nm diameter cup-shaped holes in photoresist on a glass substrate, and FIG. 5d depicts 350 nm diameter posts in photoresist on glass.

Figure 6:
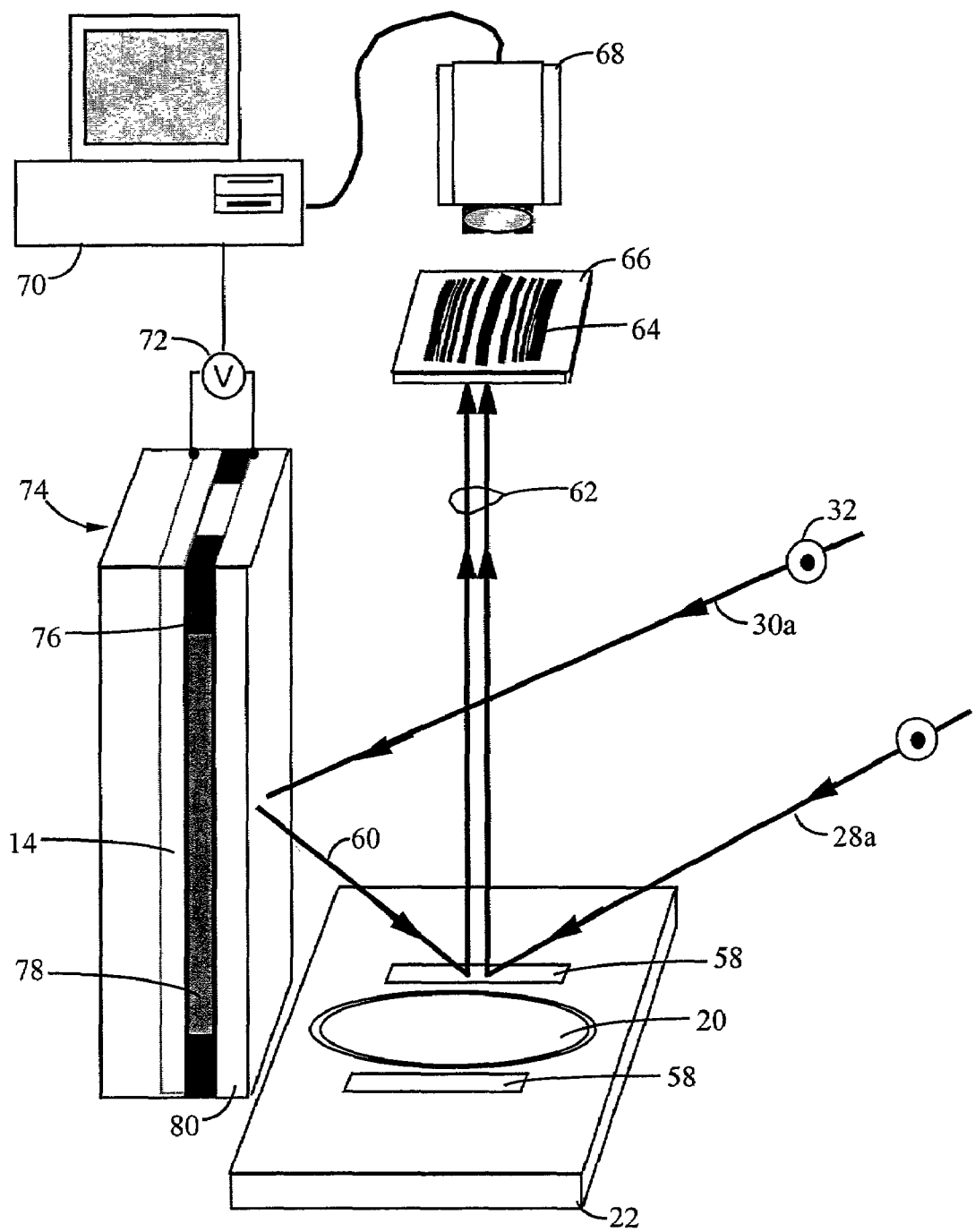
FIG. 6 is a diagrammatic view of a folding mirror, single input beam interference lithography system of the present invention, incorporating an active stabilization loop consisting of a diffractive pattern magnifier, CCD camera sensor, computer control, and liquid crystal phase shifting device.

FIG. 6 shows a system according to this invention that is capable of achieving a preferred method of the invention for actively stabilizing the interference pattern produced by a division-of-wavefront interference lithography configuration. As in FIGS. 1a and 1b above, the directly incident section of the single illuminating optical wavefront is represented by the ray 28a, while ray 30a represents the section of the incident beam which will be divided and redirected through reflection from the mirror surface 14. The state of polarization, 32, is indicated as parallel to the platform 22 containing the workpiece 20. A phase modulator 74 is shown integrated with the folding mirror 14, and consists of the following parts: a phase modulator electrode which doubles as a mirror 14; spacers to create a cell 76; an electro-optic material preferably a nematic liquid crystal 78; and substrate with transparent electrode 80. Electrodes on either side of the electro-optic material layer 78 are connected to a voltage source 72, that is operated under computer control 70. The active stabilization is done in the following way: first, a diffractive optic 58 is recorded just outside the workpiece 20, which is blocked during this exposure. The diffractive optic could be recorded in photoresist on a glass substrate for example, which could be processed and replaced in its original position, and then re-illuminated with the original beams. This results in the formation of an observable macroscopic interference pattern 64 from the diffractive optic, where this macroscopic pattern has light and dark areas with a spacing that depends on the fine adjustment of the position of the diffractive optic. In this case the co-linearly propagating beams 62 diffracted from the diffractive optic, form the magnified macroscopic pattern 64 which corresponds directly to the microscopic interference pattern desired. Using the diffusing screen 66, this pattern can be observed by eye or with an electronic imaging system such as a camera 68. Once a satisfactorily detectable macroscopic pattern 64 results, then the workpiece 20 containing the light sensitive material 16 can be unblocked and exposed to the microscopic interference pattern. Any drift in the position of the microscopic interference pattern results in a detectable change in the macroscopic pattern that is picked up by the camera 68 and fed to the control computer 70. The computer then calculates the phase error and transmits a proportional control signal to voltage source 72, which in turn modifies the voltage applied across electrodes 14 and 80 based on a calibrated phase vs. voltage relationship specific to the phase modulating device 74. In this manner, the phase of the reflected beam section 60 is delayed or advanced relative to the directly incident beam section 28a, so as to restore the features within the microscopic interference pattern to their previous position, i.e. "locked" into position. Through this active phase locking system, the high contrast of the microscopic interference pattern is reproduced within the limits of the light sensitive material. It should be noted that the preferred embodiment using liquid crystal as the electro-optic material 78 in the phase modulator 74, is illustrative, and other comparable materials could be used instead; for example, a piezo-electric crystal.

Figure 7:
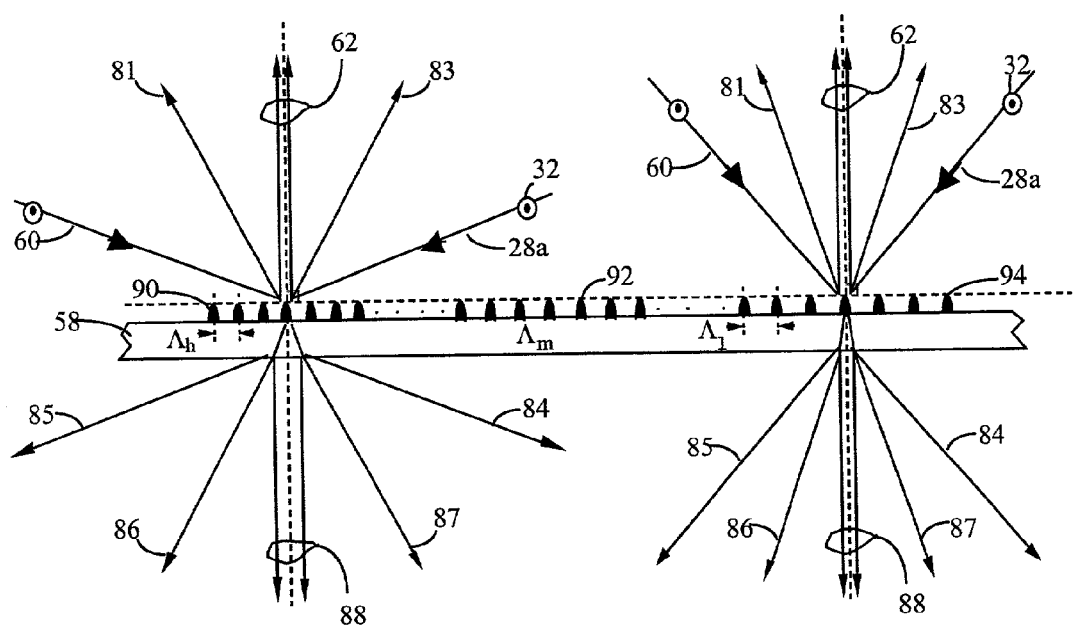
FIG. 7 is a detail schematic diagram depicting the operation of the diffractive pattern magnifier of FIG. 6.

With an interference pattern created by two overlapping beam sections as in FIG. 6, a grating structure is recorded by the light sensitive material on workpiece 20. This grating is referred to as the "recorded grating", and is to be distinguished from the "diffractive optic" 58. In order to form a macroscopic interference pattern using the diffracted beams 62, it is necessary that the period of the diffractive optic be a multiple of the recorded grating period. To use first order diffracted beams, the diffractive optic period would have to be twice that of the recorded grating, and to use second order diffracted beams, the diffractive optic period would have to be four times that of the recorded grating. FIG. 7 shows some of the diffracted orders from typical diffractive optics with high frequency Λh (small pitch), 90; medium frequency Λm (medium pitch), 92, and low frequency Λl (large pitch), 94, where the pitch is four times that of the recorded grating. Two cases are shown where the interfering beams are configured as in FIG. 1a on the left with Λh about 751 nm, and FIG. 1b on the right with Λl about 1091 nm, both assuming a wavelength in the UV of 351 nm. Beams 60 and 28a represent the overlapping sections of the illuminating beam, and the polarization state 32, is again with the electric vector perpendicular to the plane of the drawing. Beams 81 and 83 are the first order diffracted beams in reflection, and beams 86 and 87 are the transmitted first order diffracted beams split from recording beams 60 and 28a, respectively. Beams 62 and 88 are the second order diffracted beams in reflection and transmission, respectively which travel in a direction perpendicular to the plane containing the diffractive optic 58. It is evident from FIG. 7 that to use the macroscopic interference patterns created by the overlapping of beams 62 or 88 as the feedback signal of an active stabilization system, where the feedback signal results from diffracted orders, a separate diffractive optic is required for each angle of incidence of the interfering beams 60 and 28a.

Figure 8:
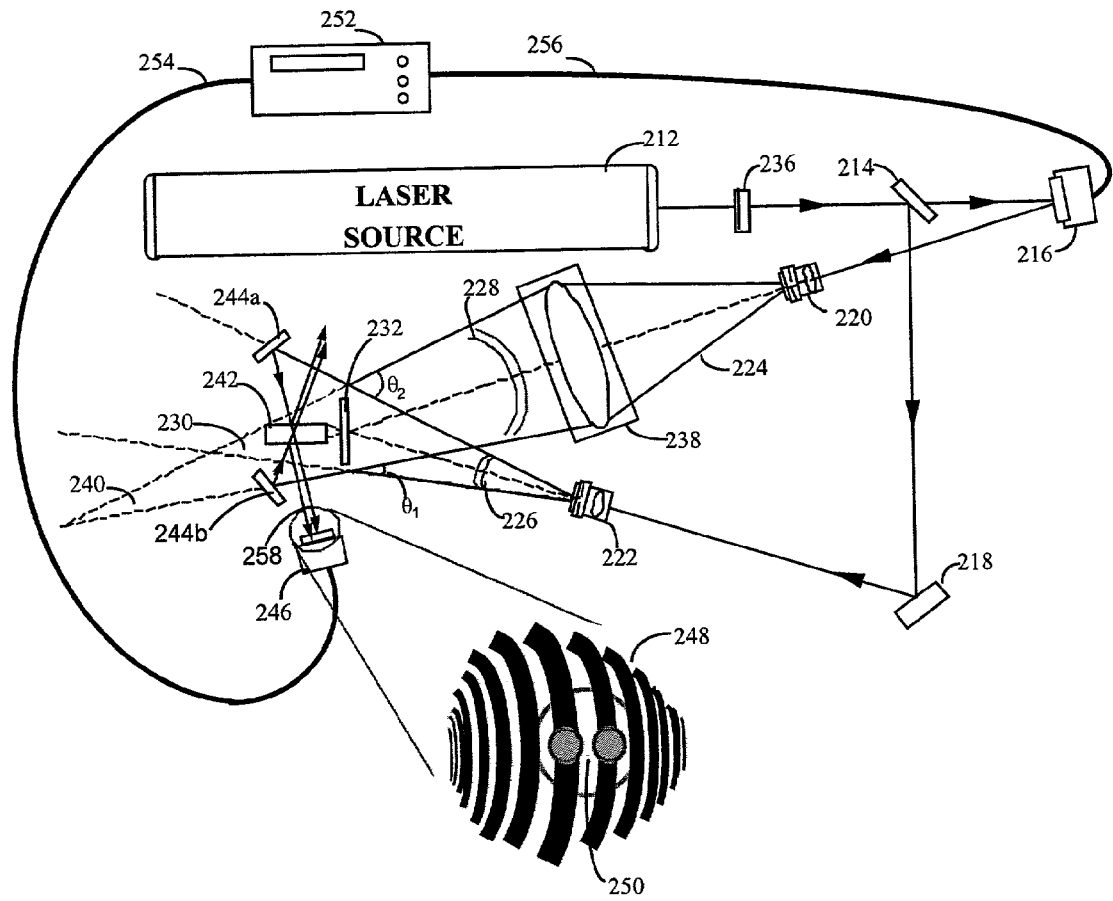
FIG. 8 depicts the interference lithography configuration suitable for manufacturing the diffractive pattern magnifier of FIG. 7 used to generate the feedback signal for active stabilization.

It is an important objective of the present invention to make a feedback device for recording interference patterns of various pitches using active stabilization. What is needed is a universal diffractive optic which can generate a feedback signal to the active stabilization control system for any illumination beam incidence angle (and consequently pattern pitch) chosen by the user. FIG. 8 depicts an interference lithography system for fabricating such a universal diffractive optic. The figure schematically depicts a system that accomplishes the recording of a so-called "chirped" grating, where the spacing of the features in the recorded pattern varies in a controllable manner over the entire length of the workpiece from one edge to the opposite edge. When a diffractive optic 58 with a chirped periodicity is placed on the platform 22 adjacent to the workpiece 20 so as to be within the region of the interfering beam sections 60 and 28a, as shown in the system of FIG. 6, a chirped macroscopic interference pattern is observable on the screen 66 where the position of the largest features in the macroscopic pattern will vary according to the angle of incidence of the illuminating beam. Preferably, the diffractive optic is constructed so as to generate a feedback signal centered on the observation screen when the illumination beam is positioned in the center of its range. An absolute calibration of the feedback signal position relative to the recorded pattern pitch can be obtained using the well known phenomenon of total internal reflection, where knowing the laser wavelength, one can determine the pattern pitch to be recorded within a fraction of a nanometer. This is accomplished by the simultaneous observation of the transmitted intensity of the illuminating beam through an un-patterned section of the diffractive optic, and the position of the largest features in the macroscopic interference pattern. The transmitted beam intensity will drop to zero at an angle known in the art as the "critical angle", the incidence angle which will lead to a pattern pitch equal to one half the illuminating beam wavelength.

In FIG. 8, a source of coherent light from a laser 212 passes through a polarization rotator 236, to beam splitter 214 which divides the amplitude of the source beam. The transmitted split beam is incident on a mirror 216 which can be translated by applying an electronic signal, preferably to a piezo-electric crystal, and is the transmitted beam is thence reflected to expansion lens, and pinhole spatial filter assembly 220. The expanded beam 224, impinges on lens 238 that produces a converging beam 228. The beam reflected from beam splitter 214, impinges on mirror 218, and is reflected to expansion lens and spatial filter 222, and emerges as diverging beam 226. Beams 226 and 228 are interfering recording beams that are incident on recording surface 232 at recording angles varying from θ1 to θ2. These angles have to be chosen so that light diffracted normally from the chirped diffractive optic covers the entire range of pitch that is desired. Situated behind the recording surface 232, are components of the active stabilization system, including two turning mirrors 244a, 244b; a beam-splitting optic 242; and a light detection sensor 246. The signal from the sensor 246 goes by cable 254, to controller electronics 252, which in turn is connected by cable 256, to the translatable mirror 216. The volume of space wherein the interfering beams overlap and an interference pattern exists, is designated as 230, and the focal point of the converging beam 228 created by lens 238, is indicated by 240. Co-linearly propagating beams 258 are produced from when a portion of beam 228 intercepted and redirected by turning mirror 244, is reflected from beam splitter 242, and a portion of beam 226 intercepted and redirected by turning mirror 244, is transmitted through beam splitter 242. Beams 258 interfere to produce a macroscopic interference pattern which falls upon the sensor 246. An magnified representation of this macroscopic interference pattern is shown as 248, where the differing curvatures of the sampled beams appears as a chirp in the pattern. The standard type of sensor used to detect any motion in the macroscopic pattern (and consequently motion in the microscopic pattern) consists of two discrete detectors 250 positioned such that the light level recorded by each individual detector is equal. A difference in the signals indicates motion of the interference pattern.

Figure 9:
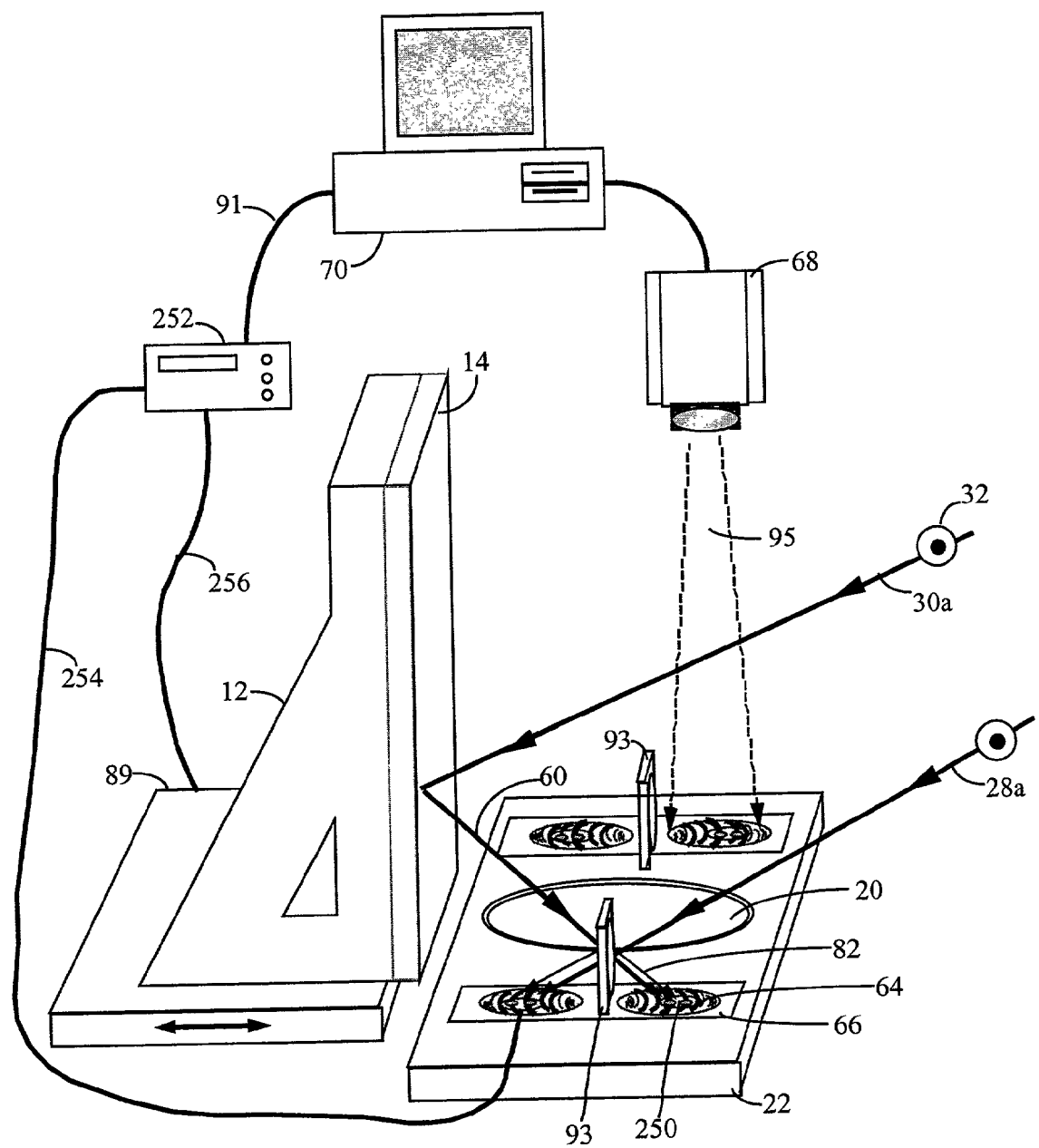
FIG. 9 is a diagrammatic view of a folding mirror, single input beam interference lithography system of the present invention, incorporating an active stabilization loop consisting of a beam splitter/combiner to generate a magnified interference pattern, a pair of detectors to generate an electronic signal, computer control, and a means for translating the position of the folding mirror.

An alternate method of actively stabilizing a division-of-wavefront interference lithography system is shown in FIG. 9. The setup is similar to FIG. 6 in that common elements are; the beam sections 28a and 30a; overlapping beam sections 60 and 28a; state of polarization 32; workpiece 20; workpiece platform 22; camera 68; and computer controller 70. The feedback apparatus is modified such that the diffractive optics have been replaced by beam splitting optics 93, and an alternative detection system 250 is employed. The phase modulator 74 incorporating the folding mirror 14 of FIG. 6, has been replaced with rigidly mounted folding mirror 14, (preferably constructed from a single block of a lightweight material such as beryllium 12) that is adjustably mounted on an electrically controllable single-axis translating platform 89. By translating the position of the folding mirror 14, the path length traveled by (and consequently the phase of) the divided beam section is modulated. This platform is driven by control electronics 252 through electrical cable 256. The control module 252 is connected to computer 70 by electrical cable 91. In a manner similar to that taught by FIG. 8, the interfering beam sections are sampled by the beam splitting optics 93 which generate colinearly propagating beams 82 that interfere to form a macroscopic patterns 64 observed on screen 66, or observed by camera 68 within the field defined by 95. Preferably, a detection system 250, which can be an array of discrete detectors, replaces screen 66 and camera 68. In this manner the displacement of the macroscopic pattern over the area outlined by screen 66, resulting from a change in the illuminating beam position or angle of incidence to the platform 20, can be observed without altering the feedback apparatus. The electronic signal from the detection system 250 is conveyed by cable 254 to the control electronics 252, thereby completing the feedback loop.

Either system of providing active stabilization of an interference lithography system described above is adequate. Both systems provide solutions for the problem of stabilizing a division-of-wavefront interference lithography system, and it is significant to note that the novel feedback apparatus described in FIGS. 6 through 8, is also applicable to division-of-amplitude interference lithography systems, where the chirped period diffractive optic is a significant advancement over other methods such as that disclosed in U.S. Pat. No. 5,142,385. The choice between the systems and methods of FIG. 6 or FIG. 9 depends on the application. The diffractive optic method described by FIG. 6 is faster, more efficient, and more suitable for production environments. The beam-splitter method described by FIG. 9 requires considerable manual adjustment between exposures to provide the correct macroscopic pattern spacing for adequate detection. It should be understood that any combination of the components in FIGS. 6 and 9 can yield an adequate stabilization system, for example combining the phase modulator 74 of FIG. 6 with the beam splitting optic 93 feedback apparatus of FIG. 9. Another embodiment would be to utilize the diffractive optic 58 of FIG. 6 with the moving mirror phase modulator 12, 89 of FIG. 9. Lastly, it should also be clear that these systems can be replicated to actively stabilize a more than two-beam interference lithography system constructed using either the division-of-wavefront or division-of-amplitude methods. For multiple beam systems, the diffractive optic feedback apparatus is particularly well suited since it can be constructed to sample beams incident from many directions simultaneously.

As is well-known in the art, the intensity distribution of a typical laser source used in an interference lithography system, is not uniform. The brightness of the beam decreases exponentially from the center following a bell-shaped, or gaussian profile. This has a strong impact on the exposure uniformity of a folding mirror interference lithography system, and is particularly troublesome in the production of gratings within DFB lasers. One solution is to enlarge the laser beam to an extent where the desired grating area is a small portion of the beam diameter and the grating is recorded near the center of the gaussian intensity distribution where the radial variation is minimal. When a gaussian beam diameter is doubled, the power per unit area is reduced by a factor of four. This leads DFB manufacturers to choose expensive, often unreliable and short lived, high power laser sources for their benchtop grating production. It is an object of the present invention to provide a more practical solution which makes use of an apodizing filter that introduces a radial variation in absorption matching the gaussian beam distribution. The result is a uniform intensity distribution over the center portion of the beam, known in the art as a flattop profile. Power per unit area in the beam is typically reduced by a factor of two using the absorptive filter, which when implemented with a smaller diameter laser beam results in a net gain in exposure energy as compared to the simple large beam approach. Alternative apodizing filters can be employed which convert the gaussian profile to a flattop profile with less power loss. Use of such filters allows the selection of a safer, more reliable, less expensive, lower power laser for DFB grating production.

Figure 10A:
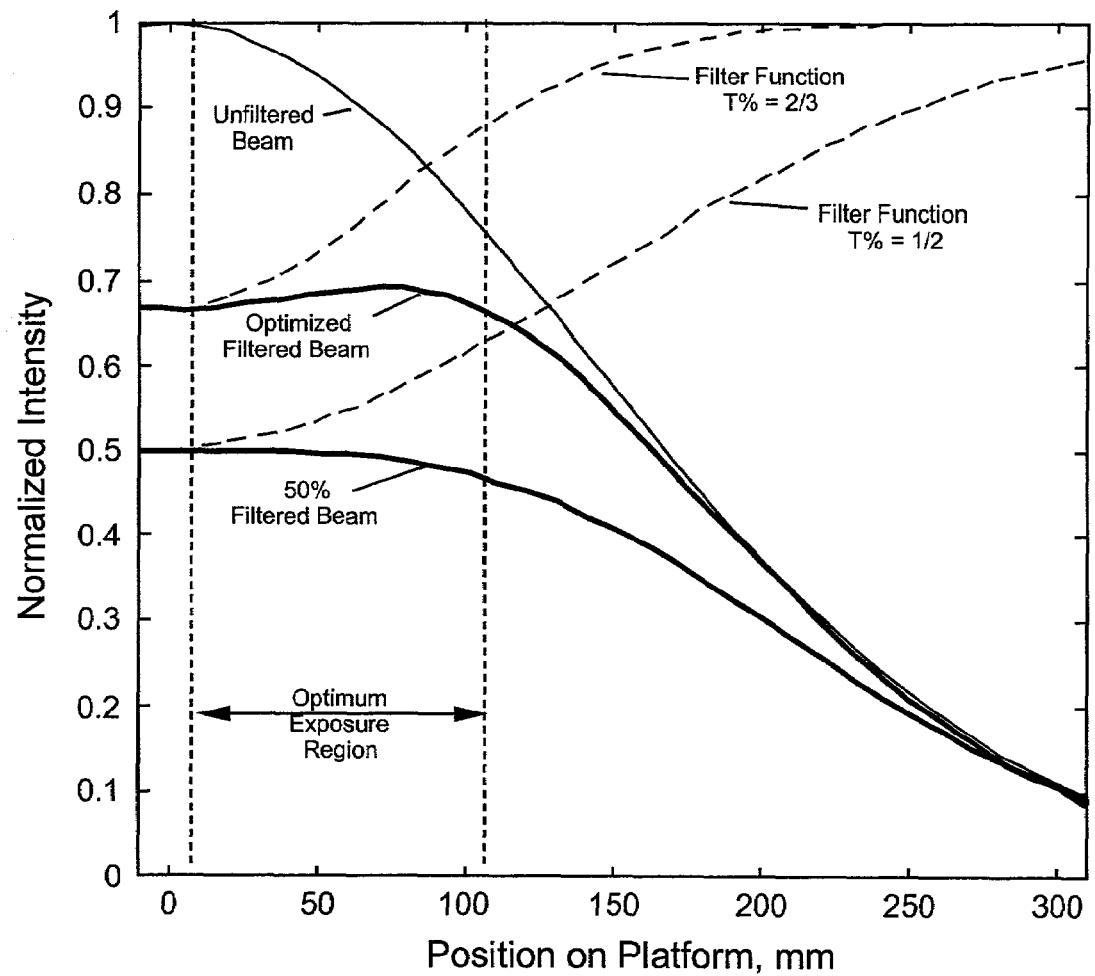
FIGS. 10a, 10b, and 10c are plots of the macroscopic intensity distribution at the center of the recording plane in a folding mirror division-of-wavefront interference lithography system of the present invention. Specifically, 10a is a plot of radial sections of the exposure area intensity distribution taken along the central axis. Multiple curves are shown indicating the effect of various beam apodizing filters; 10b is a contour plot of the exposure area intensity distribution with no apodizing filter showing a contour ring for each 5% drop in intensity; 10c is another contour plot showing improved uniformity of the intensity distribution using an optimized apodizing filter.
Figure 10B:
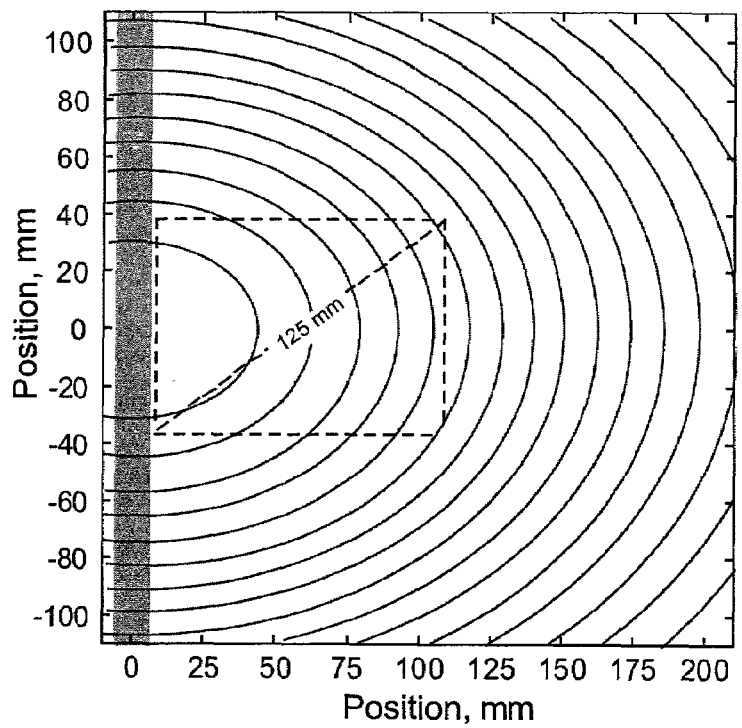
Figure 10C:
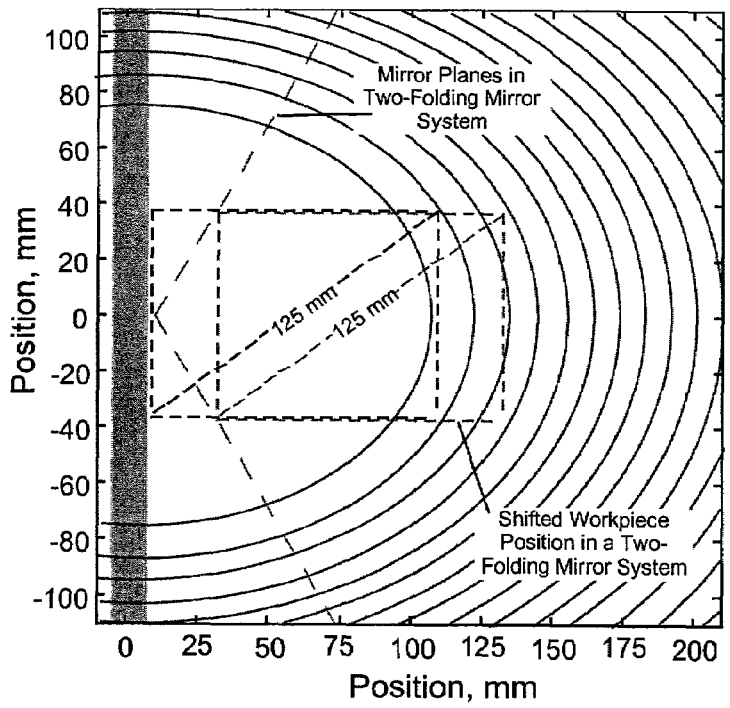

To illustrate the benefits of using an apodizing filter in the disclosed division-of-wavefront interference lithography system, FIG. 10a shows typical curves representing radial cross sections of the intensity distribution for filtered and unfiltered beams. Even though the filtered beam has an intensity that is reduced by 33% or more, the significant fact is that the profile is flat over the area occupied by the workpiece containing the light sensitive material. This means that patterns recorded at the perimeter of the light sensitive surface will have the same etched profile after processing as those recorded at the center. The extra time required for recording in this case, due to the lower beam intensity, is not significant. The importance of apodization is made even more apparent by FIGS. 10b and 10c which are top views of the macroscopic intensity distribution of the directly incident beam section of the interference lithography system disclosed herein, and projected onto the platform supporting the workpiece. Each contour represents a drop in intensity of 5%, and the outline of a 75×100 millimeter workpiece is superimposed. The gray column in the figures represents the gap between the folding mirror and platform. As seen in FIG. 10b which shows no filtration, the intensity variations over the workpiece can exceed 35%. FIG. 10c depicts a greatly reduced intensity variation (~5%) over the workpiece using an optimal two-thirds peak transmittance apodizing filter. FIG. 10c also shows dashed lines running diagonally which represent the intersection of the planes containing the mirrors in a two folding-mirror interference lithography system with the platform, and the resulting shift in the workpiece position.

Figure 11:
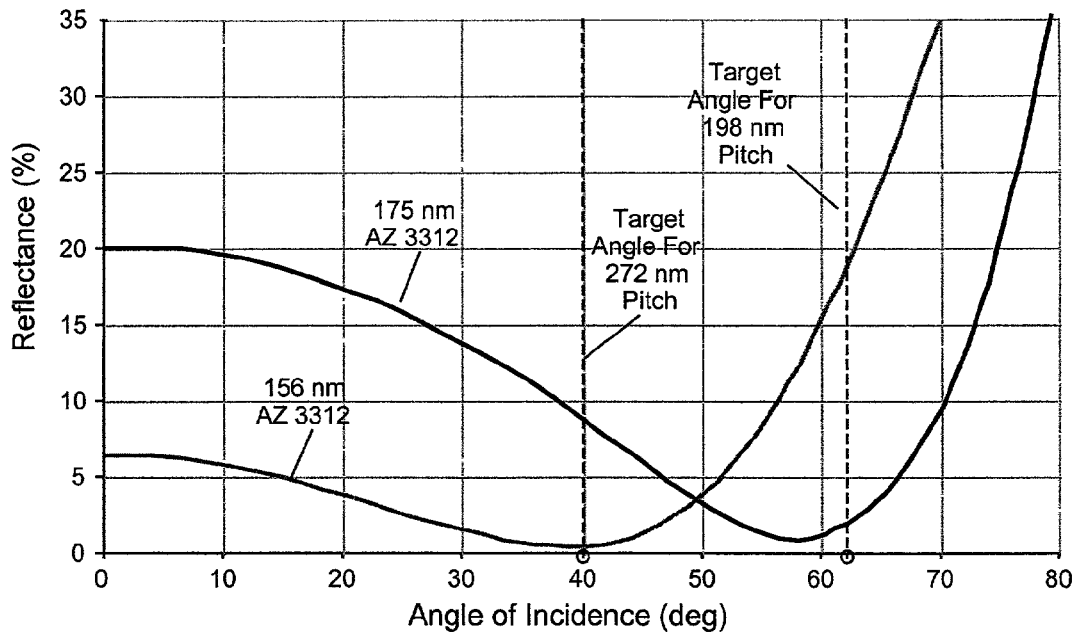
FIG. 11 is a plot of the theoretical intensity of UV light reflected from an indium phosphide wafer coated with photoresist, as a function of the light's incident angle. Two curves are shown depicting the optimized photoresist thicknesses which yield reflectivity minimums at incident angles corresponding to the maximum and minimum grating pitch needed for the production of DFB lasers.
Figure 12:
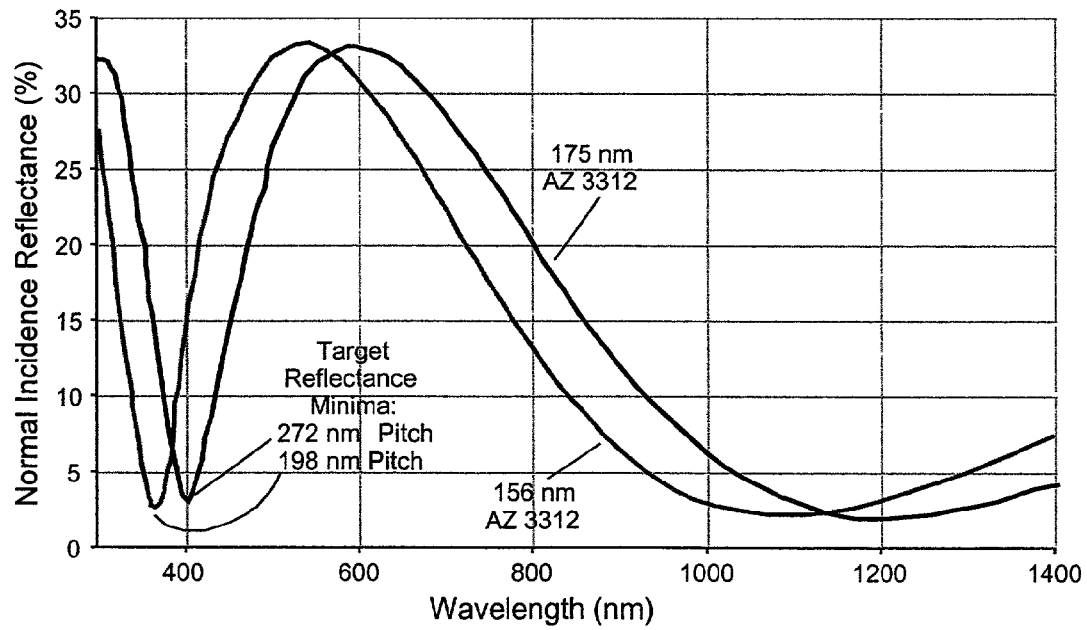
FIG. 12 is a plot predicting the normal incidence of reflection of a broad spectrum of light off the photoresist coated wafers of FIG. 11. The reflectivity minima shift significantly for varying photoresist thickness allowing a simple in process check before exposure.

FIGS. 11 and 12 are plots showing the significance of the light sensitive material thickness on the reflectance from the workpiece for various recorded pattern pitches (or illuminating beam incidence angle). In the exemplary case of the production of grating structures for DFB lasers, the workpiece consists of a substrate composed of indium phosphide coated with a thin layer of the light sensitive material known as photoresist. The aim here is to achieve reflectance minima for particular pitches so that additional material layers used to suppress reflections, are not required. FIG. 11 shows the reflectance of the interfering beams with a wavelength of 350.7 nm, where the target angles of incidence are 40 degrees corresponding to a grating pitch of 272 nm, and 62 degrees corresponding to a grating pitch of 198 nm. Reflectance minima are obtained for AZ 3312 photoresist coated to a thickness of 156 nm and 175 nm, respectively. FIG. 12 shows the reflectance at normal incidence for each photoresist coating thickness, where minima are achieved at wavelengths of 370 nm for the 198 nm pitch (thickness=156 nm), and at 400 nm for the 272 nm pitch (thickness=175 nm). The method shown in FIG. 12 can be used as an in-process check to ensure repeatable results during production.

Figure 13:
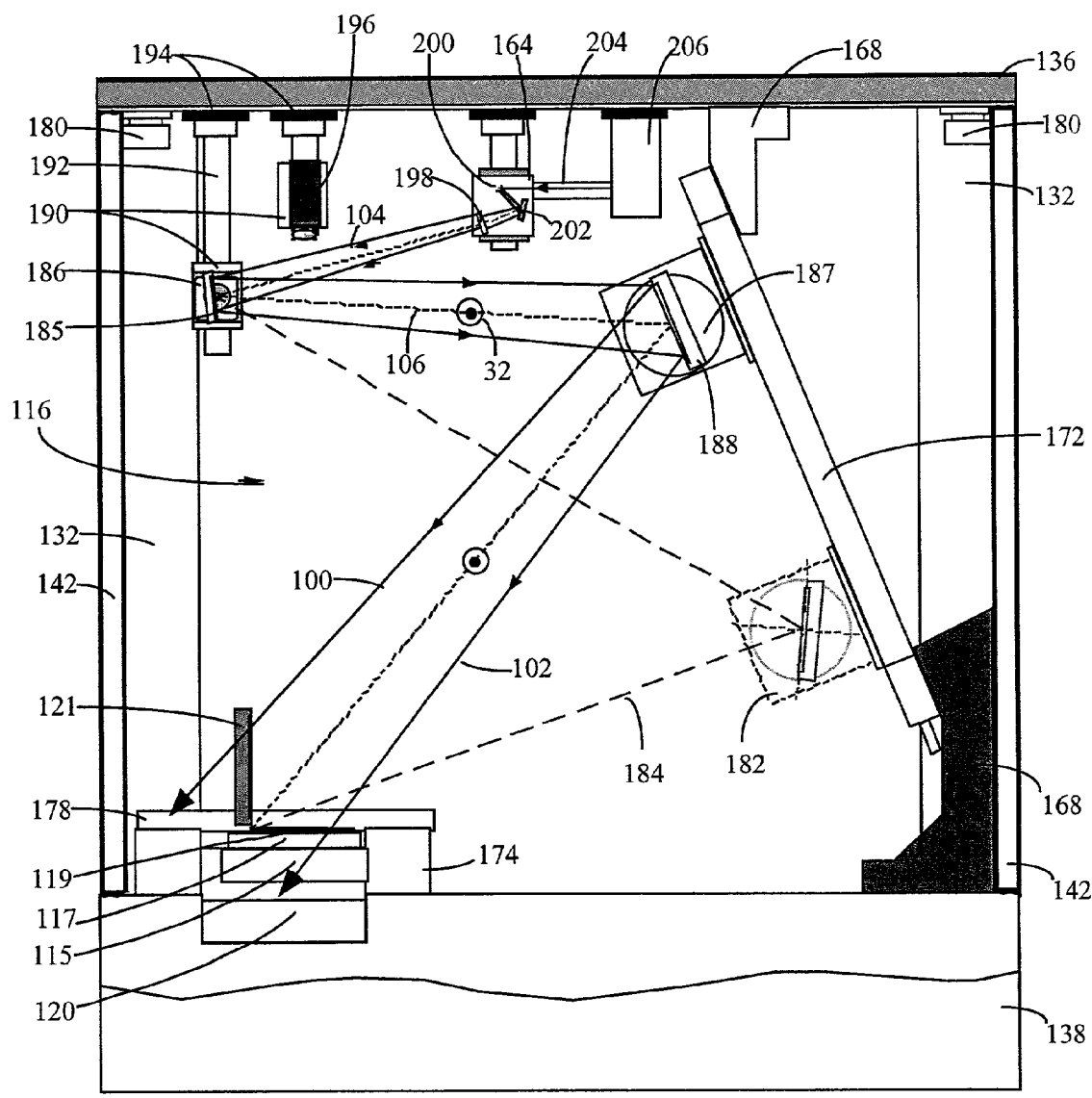
FIG. 13 is a partial front elevational view of a patterning device according to the present invention depicting a cross section of the input beam path.

FIG. 13 depicts a front elevation view in partial cross section of a preferred embodiment of the inventive patterning system of the invention. Light from the laser light source is directed by the lateral turning mirror and mount 206, through the beam path enclosure 204, and thence to the laser beam reflective expander 164. The beam hits the off-axis parabolic reflector 200, and is directed to the beam expander turning mirror 202, through the apodizing filter 198, and emerges as the expanded beam 104. Beam 104 propagates toward turning mirror 185 adjustably mounted to rotation stage 186, and is reflected as the beam relayed from the first mirror 106. The state of polarization 32, is optimally shown with the electric vector perpendicular to the plane of the drawing. Beam 106 then impinges on relay mirror 188, that is adjustably mounted upon the rotary stage for the relay mirror 187, and is reflected downwards to the recording stage, where beam 100 depicts a perimeter ray of the section of the expanded laser beam to be divided, and beam 102 depicts a perimeter ray of the directly incident section of the expanded beam. The folding mirror 121 attached to the folding mirror platform 178, is supported by the folding mirror platform posts 174. The workpiece coated with the light sensitive material 119, is situated on top of the workpiece platform 117, which is affixed to the rotation stage 115. The rotation stage and workpiece are mounted upon, and can be translated by, translation stage 120.

The incidence angle is changed by translating the relay mirror 188 using the translation stage 172, and simultaneously rotating mirror 188 using the rotation stage 187, the entire system being supported by posts 168. The position of the relay mirror at its minimum pitch position is designated as 182. At the same time that the relay mirror is moved downward to its minimum position, the turning mirror 185, is rotated to keep the beam centered on the relay mirror 188. The position of the center line of the beam at this minimal position is designated by the dotted line 184.

Other numbered components to the apparatus depicted in FIG. 13 consist of patterning chamber panel safety interlocks 180; mounting post 192; post mount carriages 190; patterning chamber 116 enclosed by panels 142, and framed by granite stanchions 132, patterning chamber base 138, and inverted breadboard 136.

Figure 14:
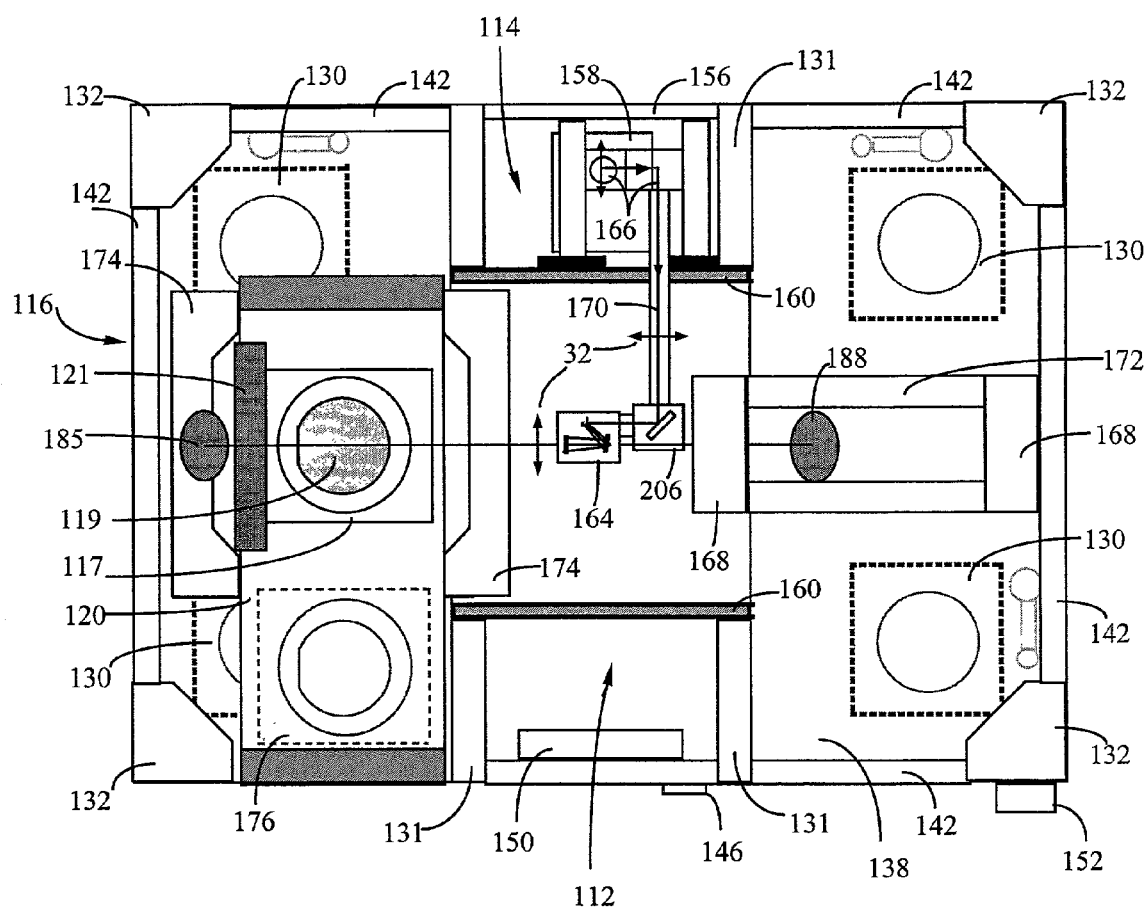
FIG. 14 is an overhead view of the patterning device of FIG. 13 depicting the input beam path.

FIG. 14 shows a plan view through all levels of the inventive patterning system of FIG. 13. The laser source 158 mounted upon the breadboard 160 framing the laser source chamber 114, emits a light beam 170 directed upwards and laterally by turning mirrors 166 where it propagates toward lateral turning mirror 206. From there the beam is directed through the reflective expander 164 where it emerges enlarged and diverging toward turning mirror 185 which reflects the beam toward relay mirror 188 and thence toward the workpiece coated with the light sensitive material 119 and folding mirror 121. The state of polarization 32, is modified through multiple lateral reflections from the turning mirrors 166 and is optimally arranged to have an electric vector which vibrates in a plane parallel to the plane containing the workpiece.

Other numbered components depicted in FIG. 14 are the granite stanchions 132; patterning chamber enclosure panels 142; patterning chamber 116; folding mirror 121; workpiece platform 117; translation stage 120; pneumatic isolators 130; workpiece platform translated to the load position 176; computer control chamber 112; computer monitor 140; stainless steel breadboards 160; granite dividers framing the laser source and computer control chambers 131; granite base 138 framing the floor of the patterning chamber 116; status signal tower 152; folding mirror platform posts 174, and laser source chamber access door 156.

Figure 15:
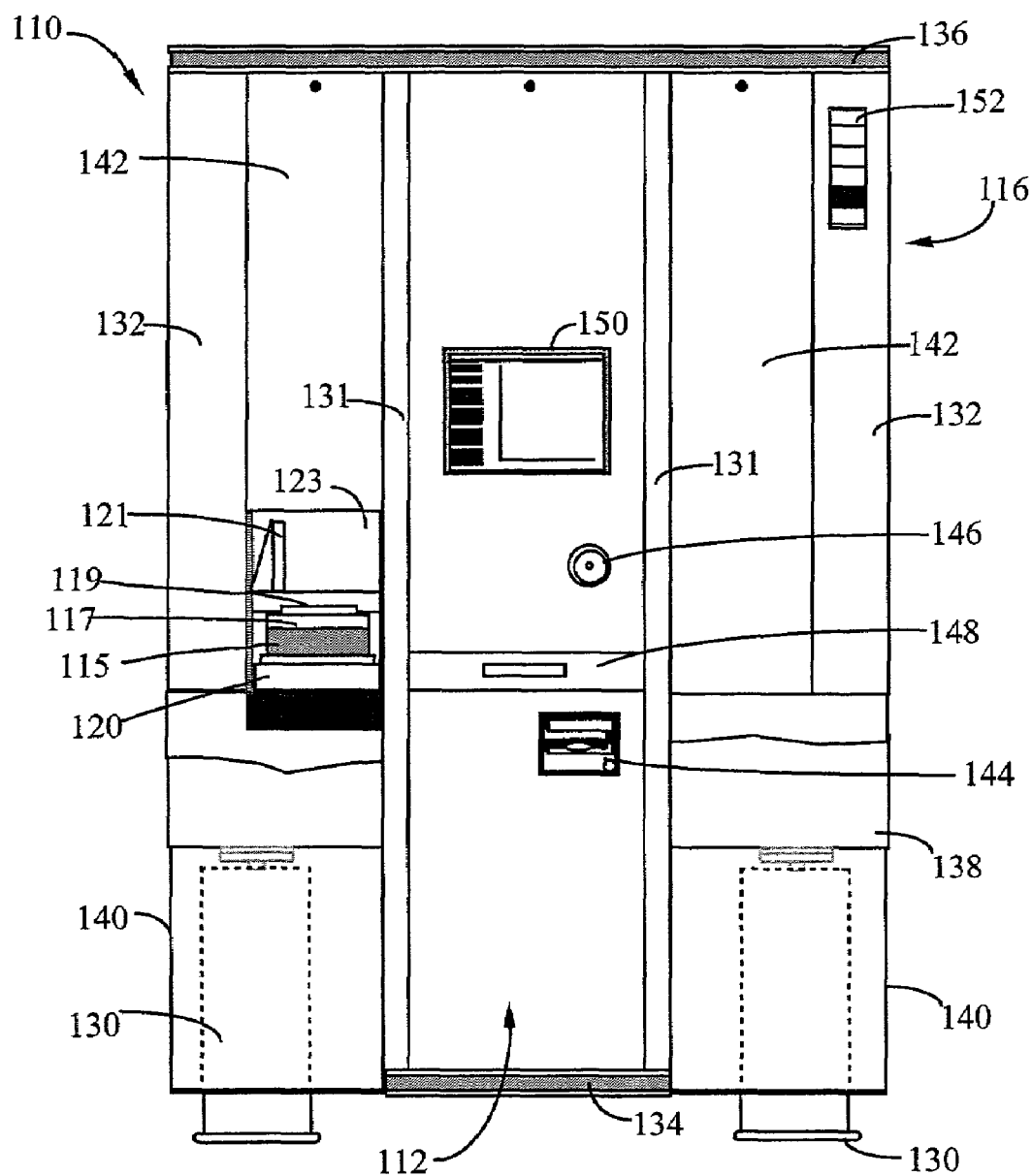
FIG. 15 is a full front elevational view depicting the superstructure forming the passive stabilization system of the patterning system of FIG. 13.
Figure 16:
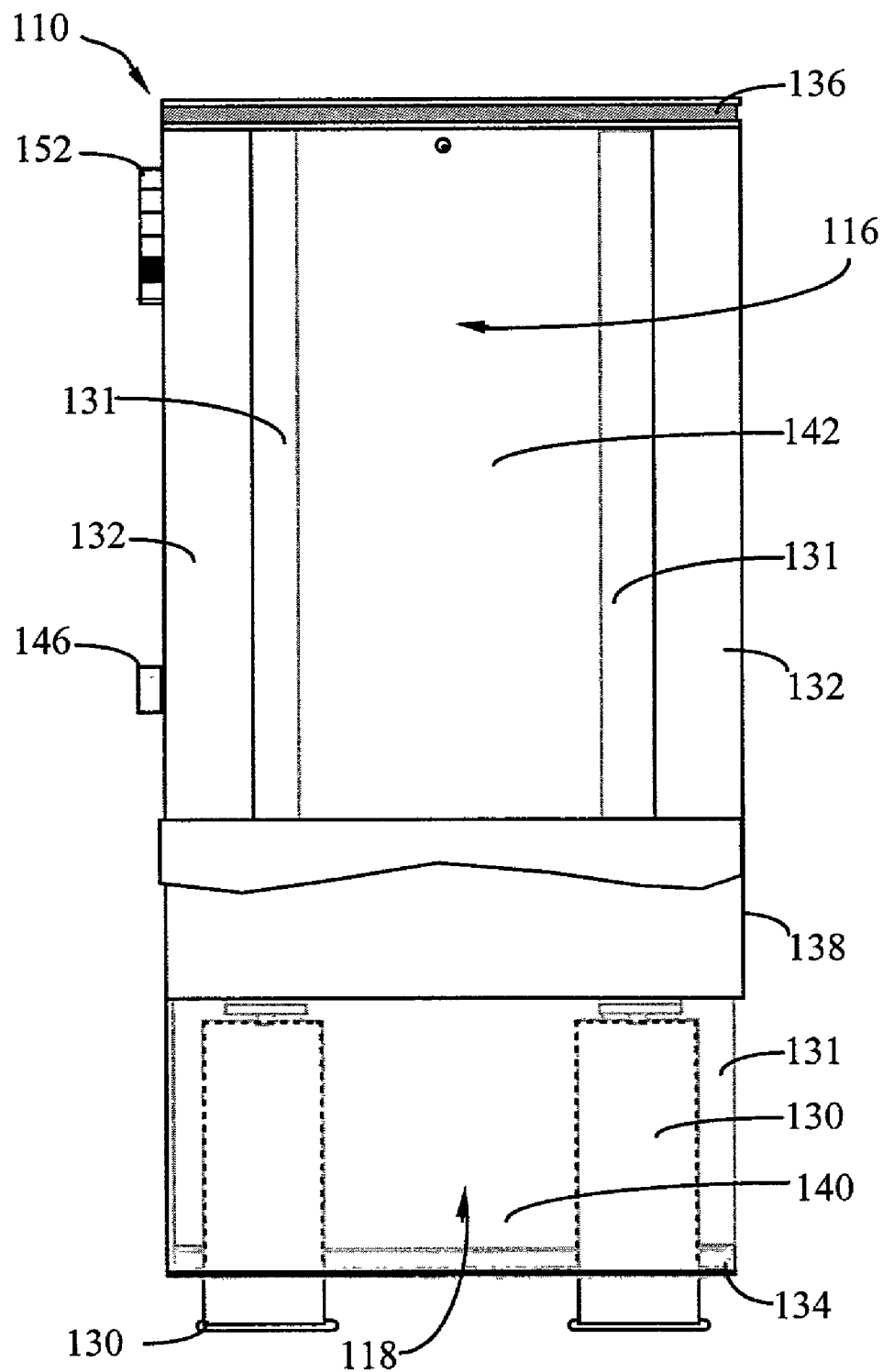
FIG. 16 is a full side elevational view depicting the superstructure forming the passive stabilization system of the patterning system of FIG. 13.
Figure 17:
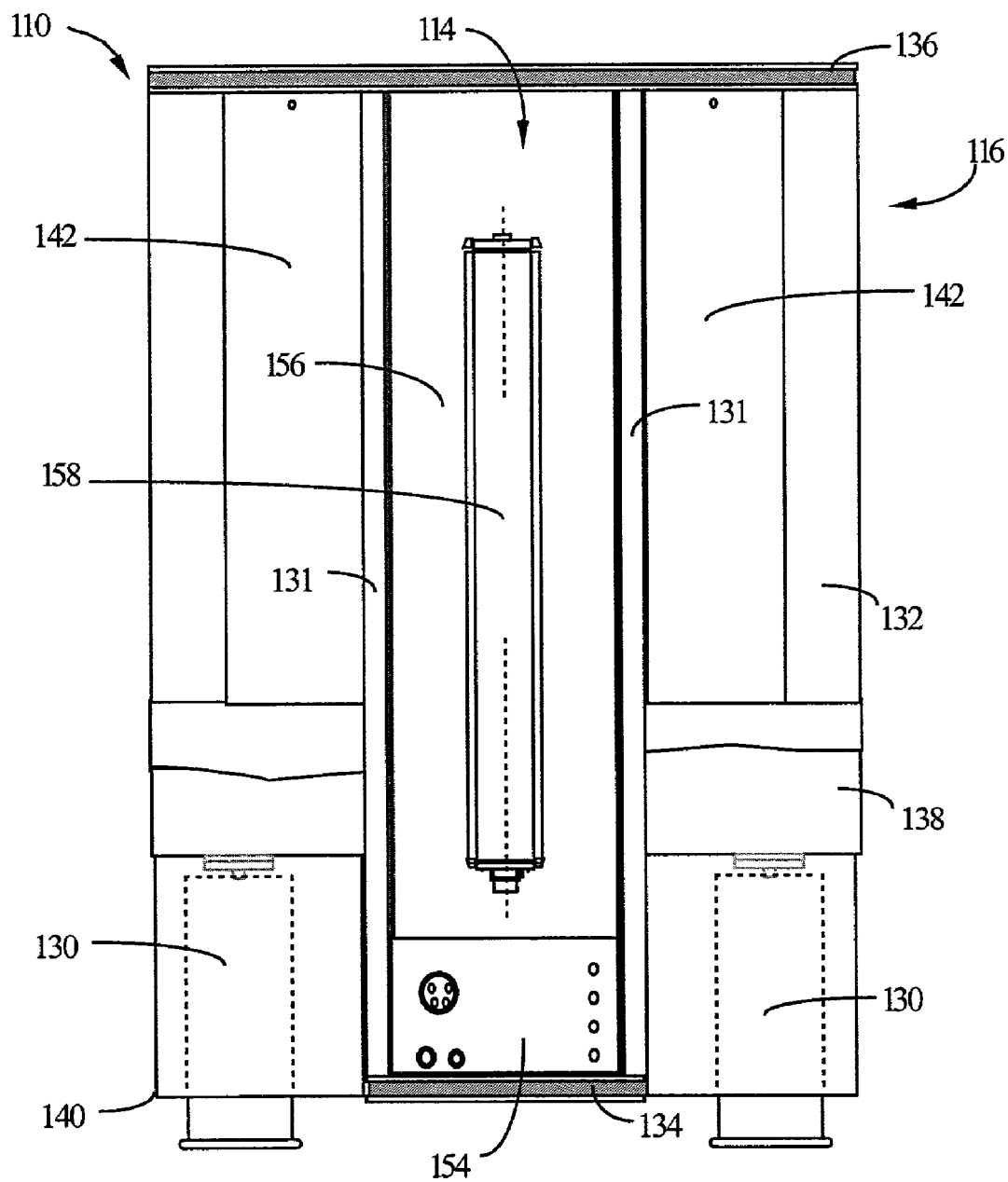
FIG. 17 is a full back elevational view depicting the superstructure forming the passive stabilization system, and the compartment housing the vertically oriented laser source for the patterning system of FIG. 13.

FIGS. 15, 16, and 17 are elevations in partial cross section illustrating front side and back views, respectively, of the exemplary interferometric lithography system of FIG. 13, employing the actively stabilized folded mirror technique of the present invention. Patterning system 110 includes four interconnecting chambers; the patterning chamber 116, the laser source chamber 114, the interconnecting facilities chamber 118, and the computer control chamber 112. The patterning chamber 116 contains a platform (e.g., a mount or chuck) 117 (i.e. for workpiece 119, folding mirror 121, and feedback pattern generators 58). The patterning chamber also houses mounts 192 and 168 for turning mirrors 185, 188, a beam expander 164, a camera and illuminator 196, and translation and rotation stages 120, 172, 187, 115, 186. The laser source chamber 114 contains a platform for mounting the laser source such that the beam emanating from the source is directed vertically. The source chamber platform consists of a breadboard 160 oriented vertically to form the back wall of the chamber, and to which other laser accessories and equipment can be secured (i.e. a mechanical shutter, turning mirrors, safety interlocks, and environmental controls). The facilities chamber 118 is formed by platform 134 located at the lowest level which spans between the computer control chamber 112 in front and the laser source chamber 114 in back. The facilities chamber platform also consists of a breadboard 134 lying horizontally to form the bottom of the chamber, and to which other equipment can be secured (i.e. facilities connections, the laser power supply, and inert gas and vacuum handling equipment). Lastly, the computer control chamber 112 consists of another breadboard 160 oriented vertically to form the back wall of the chamber, and to which the control computer, monitor 150, emergency disconnect 146, user input tray 148, electronic data storage devices 144, and other electronics and equipment can be secured (i.e. the motion controllers and drivers, status signal 152 control, active stabilization electronics, and camera controls).

To perform high precision patterning, it is necessary to isolate the laser beam path and the recording plane (e.g., the upper surface of the workpiece) from vibrations due to excessive air flow, mechanical equipment vibrations, acoustic noise and any other ambient sources of vibration. Vibration isolation is provided passively to all four chambers 118, 116, 114, and 112, in the patterning system 110 using four vertical pneumatic damping supports or isolators 130. These supports 130 float the patterning system using compressed gas (i.e. air or nitrogen). Supports 130 are enclosed by stainless steel panels 140 which form a skirt below the system base 138. To attenuate vibrations from air currents and airborne acoustic noise, the patterning chamber walls are constructed using aluminum or stainless steel skinned, foam core panels 142 typical of modem clean room wall coverings. Additional passive vibration isolation is provided by the structural elements which frame the patterning system, namely the stanchions 132, dividers 131, base 138, and breadboards 136, 134, and 160. The frame of the structure 132, 131, 138, is composed of a high density granite which dampens mechanical vibrations effectively and also provides a naturally large thermal mass to dampen the effect of environmental temperature variations. The granite frame is also polished to high precision to conform to standard clean room requirements, and to ensure that each chamber is sealed and light tight.

The single folding-mirror interference pattern produced by the exemplary embodiment described herein is useful for producing the grating structures needed within the distributed feedback laser sources employed in optical telecommunications. More generally, the technique of the present invention relates to any multiple folded mirror interference lithography system that generates interferometric patterns suitable for exposing light sensitive materials used in a variety of other applications, including but not limited to LCD technology, field emission display technology, the formation of antireflection surfaces, the formation of phase modulating optics, surface structures used as optical filters, diffusers, or reflectors, surface textures used for biomedical purposes such as sensors and filters, and the fabrication via holes and mesas for semiconductor circuitry.

Having described preferred embodiments of a new and improved actively stabilized, single-input beam interference lithography system, it is believed that other modifications, variations and changes will be suggested to those skilled in the art in view of the teachings herein. It is therefore to be understood that all such variations, modifications and changes, are believed to fall within the scope of the present invention as defined by the appended claims.

What is claimed is:

1. A single input beam, division-of-wavefront interference lithography system for generating repetitive patterns suitable for recording by a light sensitive material, comprising:
   a platform for mounting a workpiece composed of or containing a light sensitive material on its surface;
   a beam delivery system for dividing a single optical beam into two or more sections, wherein one or more of the sections is reflected, and one of the sections is non-reflected, said beam delivery system comprising: one or more folding mirrors, each folding mirror reflecting a section of the beam and redirecting the reflected section toward said platform such that the reflected section or sections overlap with the non-reflected section, and the sections all interfere with one another to form an optical interference pattern in the vicinity of the workpiece; a support structure on which the one or more folding mirrors are adjustably mounted; means for adjusting the positions and angles of the one or more folding mirrors relative to said platform; and an adjustable apparatus for enlarging and directing the single optical beam toward said platform and folding mirror or mirrors; and
   an active stabilization system configured to sense and control the relative phases between the divided beam sections such that the position and contrast of the optical interference pattern remains relatively constant over time, said active stabilization system comprising: a feedback apparatus for individually sampling each interfering beam section and indicating in response the relative optical phase between said beam sections, wherein said feedback apparatus comprises a diffractive optical element located next to the workpiece on said platform such that portions of each interfering beam section are redirected through diffraction from the diffractive optical element, and these sampled portions propagate co-linearly, in a direction away from said platform, so that a macroscopic interference pattern between the sampled portions is created and can be observed; a phase modulating apparatus for adjusting the phase of an interfering beam section; and a control system, responsive to the feedback apparatus, for generating a proportionate control signal and providing it to the phase modulating apparatus to hold constant the relative phase between two interfering beam sections.

2. The system of claim 1, wherein the folding mirror surfaces are substantially flat.

3. The system of claim 1, wherein the folding mirror surfaces are curved.

4. The system of claim 1, wherein the reflective surfaces of the folding mirrors are composed of a metal.

5. The system of claim 1, wherein the reflective surfaces of the folding mirrors are composed of multiple layers of dielectric materials.

6. The system of claim 1, wherein the single optical beam is transferred from a laser source to the workpiece and folding mirror or mirrors through reflection from a series of relay mirrors.

7. The system of claim 6, wherein the single optical beam is enlarged and directed toward the workpiece and folding mirror or mirrors through reflection from a series of curved relay mirrors.

8. The system of claim 6, wherein the single optical beam is relayed by the relay mirrors over a distance large enough to increase the beam's natural radius of curvature to a level approaching a plane parallel collimated beam.

9. The system of claim 1, wherein said phase modulating apparatus comprises an electro-optic material integrated with a highly reflecting element.

10. The system of claim 9, wherein said electro-optic material is a nematic liquid crystal contained within a cell constructed from one transmissive window and one highly reflecting window.

11. The system of claim 1, wherein said control system comprises an electronic light detection means sufficient to observe the macroscopic interference pattern produced by the feedback apparatus, and means for communicating the electronic image; one or more electronic detectors sufficient to generate an electronic signal proportional to the intensity of the optical beam; a control means sufficient to receive and process the electronic image from the light detection means and the electronic signal, and in response to generate a suitable electronic impulse that is provided to the phase modulator.

12. The system of claim 1, wherein said feedback apparatus comprises a diffractive optical element that comprises a diffractive optic with a chirped periodicity, to create a macroscopic interference pattern at a position in space which does not change when the angle of incidence of the single illuminating beam is varied.

13. An interference lithography system for generating repetitive patterns suitable for recording by a light sensitive material, comprising:
   a platform for mounting a workpiece composed of or containing a light sensitive material on its surface; and
   a beam delivery system for dividing a single optical beam into three or more sections, wherein two or more of the sections are reflected, and one of the sections is non-reflected, said beam delivery system comprising: at least two folding mirrors, each folding mirror reflecting a section of the beam and redirecting the reflected section toward said platform such that the reflected sections overlap with the non-reflected section, and the sections all interfere with one another to form an optical interference pattern in the vicinity of the workpiece; a support structure on which the folding mirrors are adjustably mounted; and means for adjusting the positions and angles of the folding mirrors relative to said platform.

14. The system of claim 13, further comprising a prism in optical contact with the light sensitive material and that intercepts the single optical beam before it reaches the folding mirror or mirrors, said prism refracting the illuminating optical beam incident on said prism and transmitting the refracted illuminating beam toward the workpiece, the prism having at least two reflective surfaces that divide the illuminating beam into sections by reflection, and redirect these reflected sections toward the workpiece in an overlapping manner to form an optical interference pattern, such that the light sensitive material is selectively exposed to the interference pattern produced by the overlapping beam sections propagated within said prism.

15. The system of claim 14, wherein said prism is in optical contact with the light sensitive surface via an intervening fluid having an optical index of refraction greater than the index of the ambient environment.

16. The system of claim 14, wherein said prism has a base facing said platform and a single inclined face that receives the optical beam.

17. A method of performing division-of-wavefront interference lithography for generating repetitive patterns suitable for recording by a light sensitive material, the method comprising the steps of:
 (a) generating a coherent illuminating light source beam that is enlarged and directed toward the light sensitive material with. an optical configuration that allows the position and angle of the illuminating beam relative to the light sensitive material to be adjusted;
 (b) dividing the illuminating beam into three or more sections, with one non-reflected section and two or more reflected sections, the reflected sections created through reflection from mirrors oriented to cause the reflected beam sections to overlap the non-reflected beam section in the region of the light sensitive material to form an optical interference pattern; and
 (c) exposing the light sensitive material with the light interference pattern formed by the overlapping reflected beam sections and non-reflected beam section.

18. A method of performing division-of-wavefront interference lithography for generating repetitive patterns suitable for recording by a light sensitive material, the method comprising the steps of:
 propagating a coherent illuminating light source beam through an ambient environment having a known index of refraction;
 passing the illuminating beam through a medium having a higher index of refraction than the ambient environment index of refraction, the illuminating beam thus refracted by the medium;
 dividing the illuminating beam propagating within the higher index medium into three or more sections, with one non-reflected section and two or more reflected sections, the reflected sections created by reflection from mirrors in optical contact with the higher index medium and oriented to cause the reflected beam sections to overlap the non-reflected beam section in the region of the light sensitive material to form an optical interference pattern; and
 exposing the light sensitive material, also located within the higher index medium, with the light interference pattern formed by the overlapping reflected beam sections and non-reflected beam section.

* * * * *

UNITED STATES PATENT AND TRADEMARK OFFICE
CERTIFICATE OF CORRECTION

| | | |
|---|---|---|
| PATENT NO. | : 7,304,775 B2 | Page 1 of 1 |
| APPLICATION NO. | : 09/798746 | |
| DATED | : December 4, 2007 | |
| INVENTOR(S) | : Douglas H. Hobbs and James J. Cowan | |

It is certified that error appears in the above-identified patent and that said Letters Patent is hereby corrected as shown below:

On Title Page

Item (73) Assignee: CoHo Holdings, LLC, Burlington, MA (US)

has been changed to:

Aztec Systems, Inc., Lexington, MA (US)

Signed and Sealed this

Third Day of August, 2010

David J. Kappos
*Director of the United States Patent and Trademark Office*